(12) United States Patent
Chen et al.

(10) Patent No.: US 11,139,225 B2
(45) Date of Patent: Oct. 5, 2021

(54) DEVICE INCLUDING A PLURALITY OF LEADS SURROUNDING A DIE PADDLE AND METHOD FOR MANUFACTURING THE SAME

(71) Applicant: Advanced Semiconductor Engineering, Inc., Kaohsiung (TW)

(72) Inventors: Kuang-Hsiung Chen, Kaohsiung (TW); Chih-Hung Hsu, Kaohsiung (TW); Mei-Lin Hsieh, Kaohsiung (TW); Yi-Cheng Hsu, Kaohsiung (TW); Yuan-Chun Chen, Kaohsiung (TW); Yu-Shun Hsieh, Kaohsiung (TW); Ko-Pu Wu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/442,286

(22) Filed: Jun. 14, 2019

(65) Prior Publication Data

US 2020/0395275 A1    Dec. 17, 2020

(51) Int. Cl.
*H01L 23/49* (2006.01)
*H01L 23/495* (2006.01)
*H01L 23/498* (2006.01)

(52) U.S. Cl.
CPC .. *H01L 23/49503* (2013.01); *H01L 23/49517* (2013.01); *H01L 23/49861* (2013.01)

(58) Field of Classification Search
CPC .................. H01L 23/49861; H01L 23/49503
USPC .......................................... 257/676; 438/123
See application file for complete search history.

(56) References Cited

U.S. PATENT DOCUMENTS

| 2003/0164554 | A1* | 9/2003 | Fee ..................... H01L 21/4842 257/787 |
| 2005/0199987 | A1* | 9/2005 | Danno .................... H01L 23/50 257/672 |
| 2012/0168921 | A1* | 7/2012 | Tan ..................... H01L 21/4832 257/676 |
| 2015/0371933 | A1* | 12/2015 | Jeon ..................... H01L 23/3114 257/669 |
| 2017/0005028 | A1* | 1/2017 | Talledo ................. H01L 21/568 |
| 2019/0206768 | A1* | 7/2019 | Shibuya ............ H01L 23/49541 |

* cited by examiner

*Primary Examiner* — Didarul A Mazumder
(74) *Attorney, Agent, or Firm* — Foley & Lardner LLP

(57) ABSTRACT

A device includes a die paddle and a plurality of leads. The leads surround the die paddle. Each of the leads includes an inner lead portion adjacent to and spaced apart from the die paddle, an outer lead portion opposite to the inner lead portion and a bridge portion between the inner lead portion and the outer lead portion. The inner lead portion has an upper bond section connected to the bridge portion and a lower support section below the upper bond section. A sum of a thickness of the upper bond section and a thickness of the lower support section is greater than a thickness of the bridge portion.

22 Claims, 36 Drawing Sheets

DEVICE INCLUDING A PLURALITY OF LEADS SURROUNDING A DIE PADDLE AND METHOD FOR MANUFACTURING THE SAME

BACKGROUND

1. Field of the Disclosure

The present disclosure relates to a device and a manufacturing method, and to a device including a plurality of leads surrounding a die paddle and a method for manufacturing the device.

2. Description of the Related Art

As for semiconductor devices such as quad flat non-leaded package (QFN), a length of each of the leads is constrained and cannot be further lengthened since the structural strength of the lead may become weak after manufacturing. However, lengthening the length of the lead may be specified when a smaller semiconductor die is attached to the die paddle, to ensure the leads may be still near the smaller semiconductor die and prevent the bonding wire from being longer than its optimum length.

In addition, a support kit is specified to support bonding ends of the leads to prevent the leads from shaking or deforming during a wire bonding process. However, a manufacturing error may cause dimension errors of the support kit and the leads, thereby generating a gap between the support kit and the bonding ends of the leads. The gap may cause the leads from shaking during wire bonding process.

SUMMARY

In some embodiments, a device includes a die paddle and a plurality of leads. The leads surround the die paddle. Each of the leads includes an inner lead portion adjacent to and spaced apart from the die paddle, an outer lead portion opposite to the inner lead portion and a bridge portion between the inner lead portion and the outer lead portion. The inner lead portion has an upper bond section connected to the bridge portion and a lower support section below the upper bond section. A sum of a thickness of the upper bond section and a thickness of the lower support section is greater than a thickness of the bridge portion.

In some embodiments, a device includes a die paddle, a semiconductor die, a plurality of leads, a plurality of bonding wires, an encapsulant and a coating. The semiconductor die is disposed on the die paddle. The leads surround the die paddle. Each of the leads includes an inner lead portion adjacent to and spaced apart from the die paddle, an outer lead portion opposite to the inner lead portion and a bridge portion between the inner lead portion and the outer lead portion. The inner lead portion has an upper bond section connected to the bridge portion. The bonding wires electrically connect the semiconductor die and the upper bond section of each of the inner lead portions. The encapsulant covers the semiconductor die, the die paddle, the bonding wires and the leads, and defines at least one opening on a bottom surface thereof to expose a bottom surface of the upper bond section of the inner lead portion. The coating is disposed in the opening to cover the bottom surface of the upper bond section of the inner lead portion.

In some embodiments, a method for manufacturing a device includes: (a) providing a metal plate; and (b) etching the metal plate to form a lead frame, wherein the lead frame includes a die paddle and a plurality of leads surrounding the die paddle, each of the leads includes an inner lead portion, an outer lead portion and a bridge portion between the inner lead portion and the outer lead portion, wherein the inner lead portion is adjacent to and is spaced apart from the die paddle, the inner lead portion has an upper bond section connected to the bridge portion and a lower support section below the upper bond section, and a sum of a thickness of the upper bond section and a thickness of the lower support section is greater than a thickness of the bridge portion.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
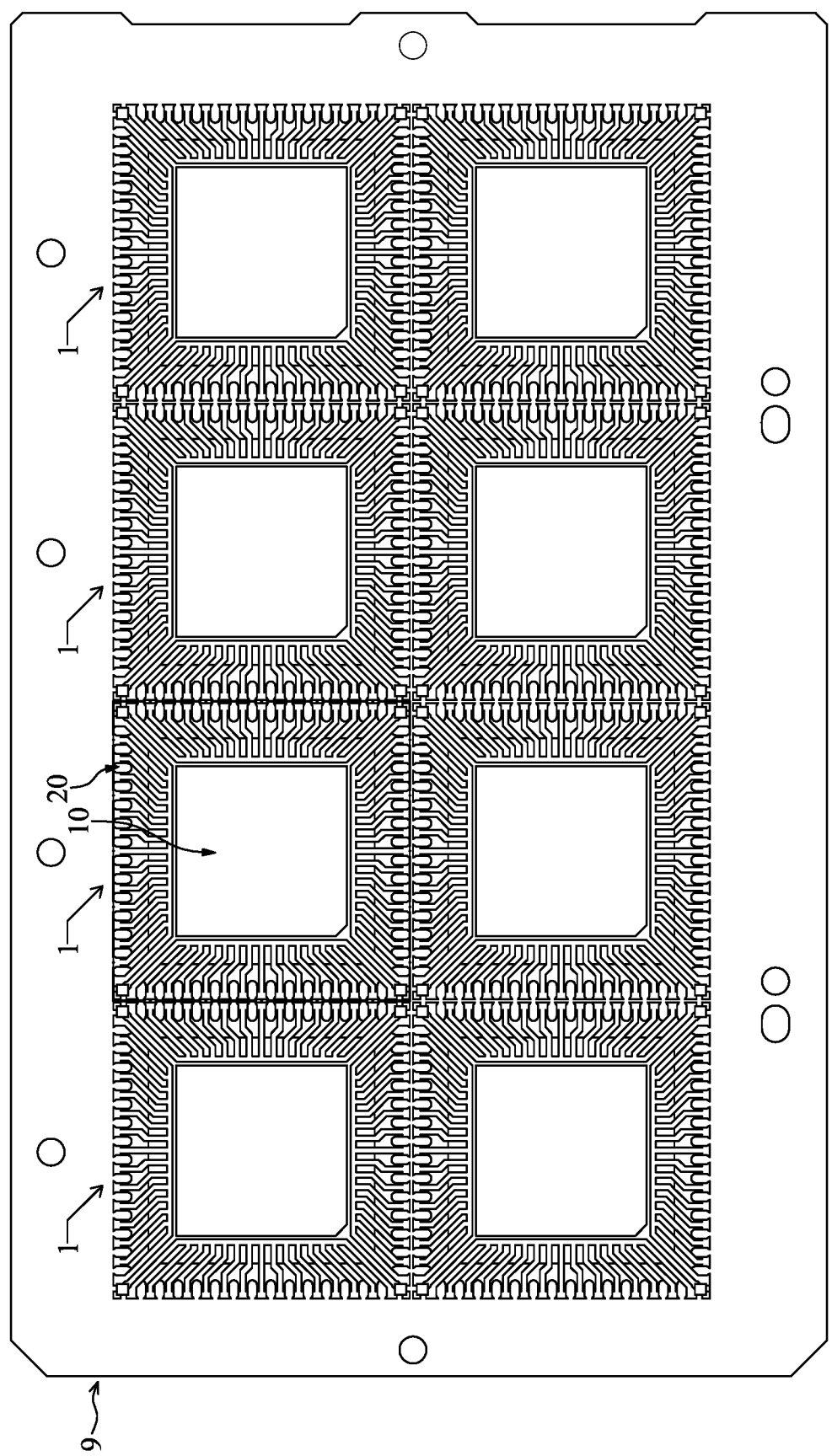
FIG. 1 illustrates a bottom view of a lead frame according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
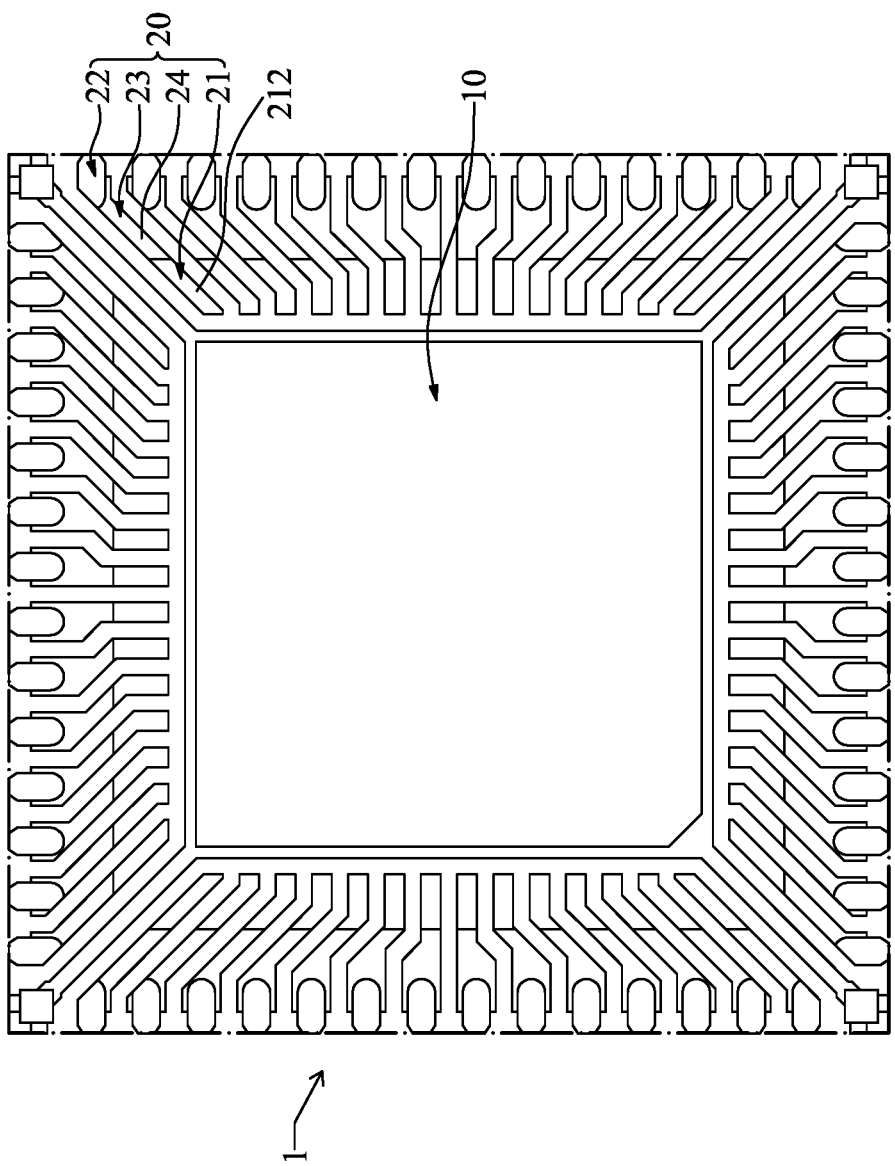
FIG. 2 illustrates a partially enlarged view of FIG. 1.
Figure 3:
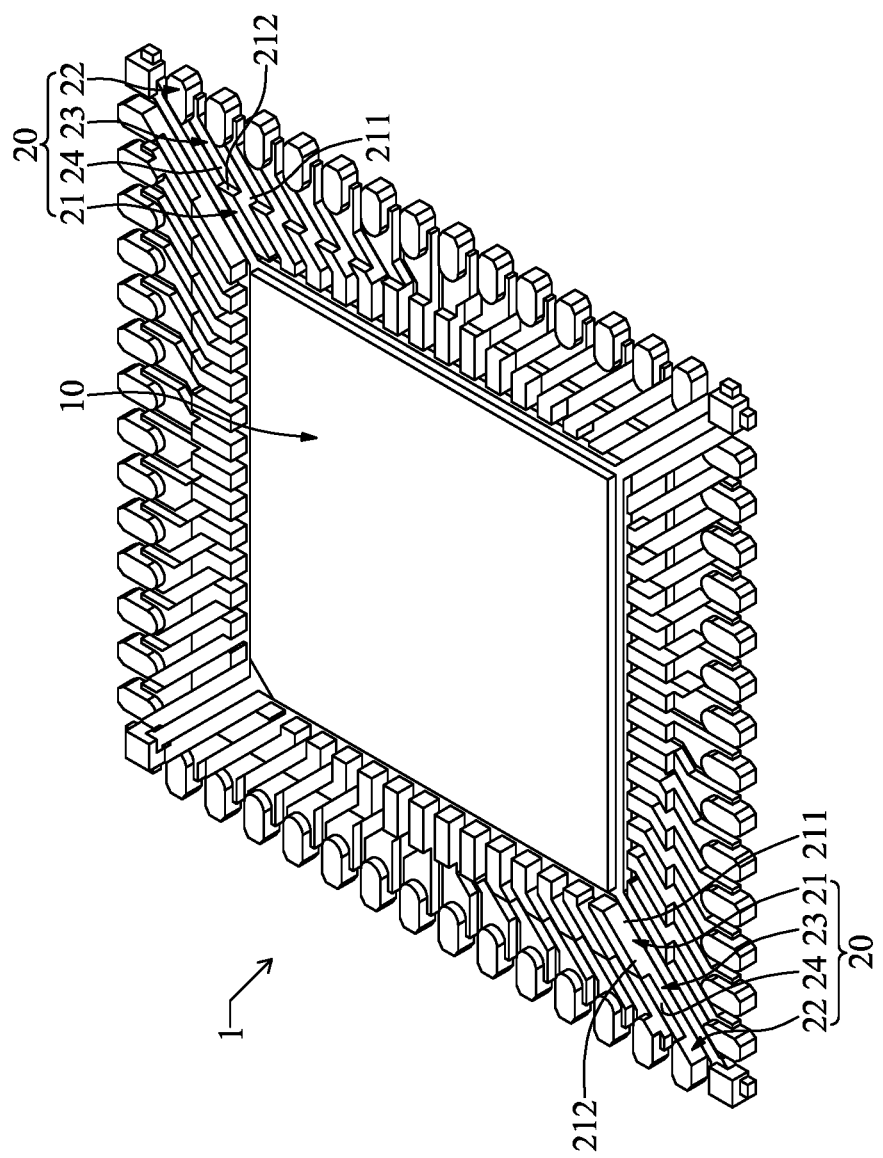
FIG. 3 illustrates a perspective view of FIG. 2.
Figure 4:
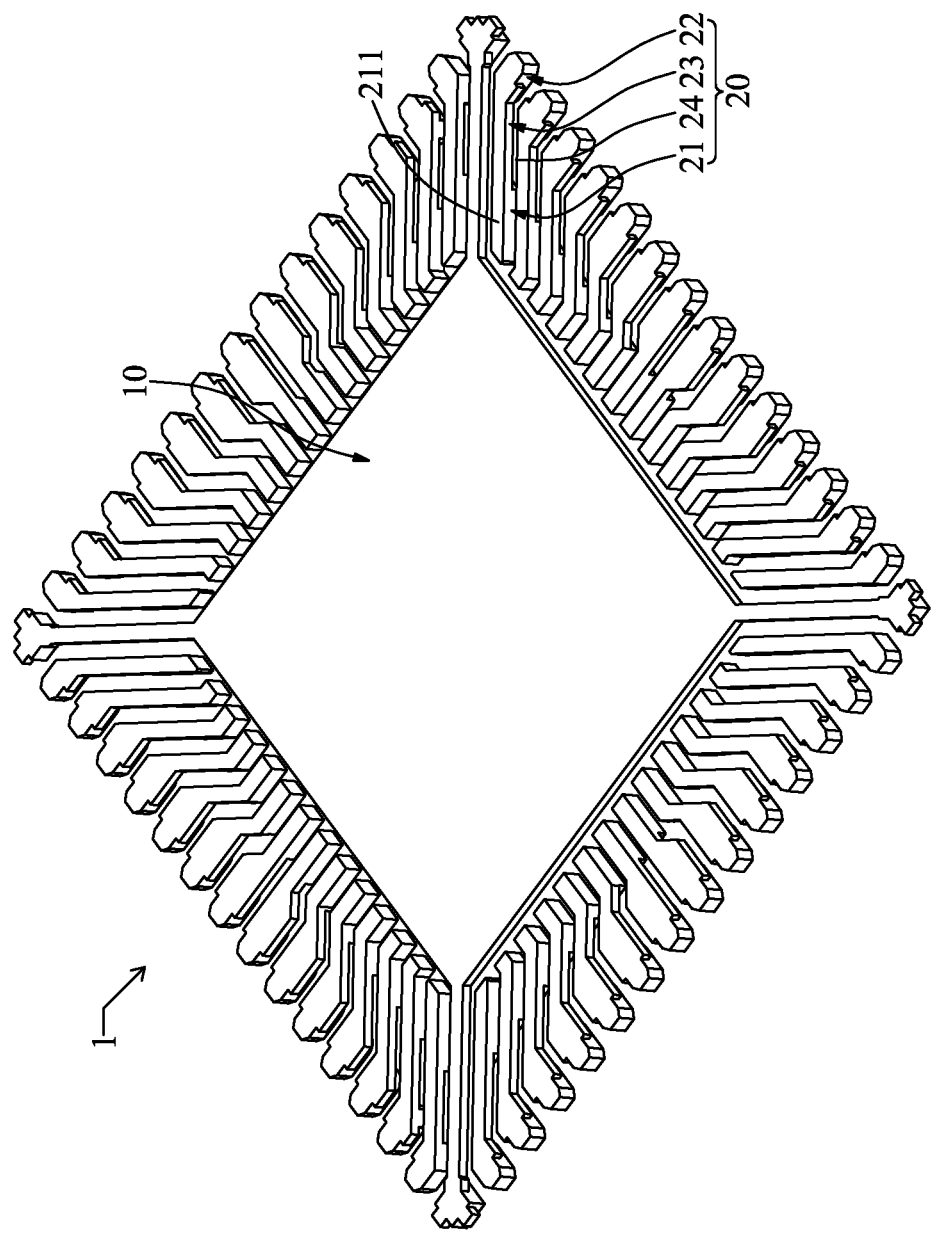
FIG. 4 illustrates a top perspective view of FIG. 3.

FIG. 1 illustrates a bottom view of a lead frame 9 according to some embodiments of the present disclosure. FIG. 2 illustrates a partially enlarged view of FIG. 1. FIG. 3 illustrates a perspective view of FIG. 2. FIG. 4 illustrates a top perspective view of FIG. 3. Referring to FIG. 1, the lead frame 9 may include a plurality of devices 1 (e.g., lead frame units) arranged in an array. Referring to FIGS. 2-4, the device 1 includes a die paddle 10 and a plurality of leads 20 surrounding the die paddle 10. In some embodiments, the lead frame 9 may be also referred to as a "device", and the device 1 may be also referred to as a "lead frame".

Figure 5:
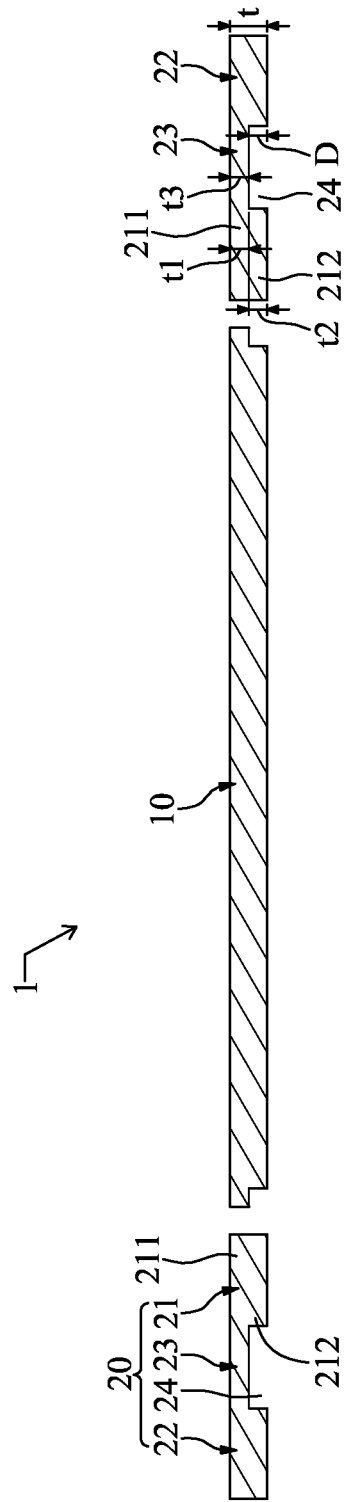
FIG. 5 illustrates a cross-sectional view of FIG. 4.

FIG. 5 illustrates a cross-sectional view of FIG. 4. Referring to FIGS. 1 and 5, each of the leads 20 includes an inner lead portion 21, an outer lead portion 22 and a bridge portion 23, and defines a cavity 24. The inner lead portion 21 is adjacent to and spaced apart from the die paddle 10. The outer lead portion 22 is opposite to the inner lead portion 21. The bridge portion 23 is between the inner lead portion 21 and the outer lead portion 22. In some embodiments, the inner lead portion 21, the outer lead portion 22 and the bridge portion 23 are formed integrally (e.g. and concurrently) as a monolithic structure. That is, each of the leads 20 may be a monolithic structure.

The inner lead portion 21 has an upper bond section 211 connected to the bridge portion 23 and a lower support section 212 below the upper bond section 211. In some embodiments, the upper bond section 211 may be a place for receiving an end of a bonding wire. That is, the end of the bonding wire is connected or bonded to the upper bond section 211. Further, the lower support section 212 may contact a table of a wire bonding machine during a wire bonding process. In some embodiments, the lower support section 212 and the upper bond section 211 are formed integrally (e.g. and concurrently) as a monolithic structure, thus there is no gap or boundary between the lower support section 212 and the upper bond section 211 to prevent the lead 20 from shaking or deforming during the wire bonding process. A material of the lower support section 212 is same as a material of the upper bond section 211.

To improve the structural strength of the lead 20 and allow the length of the lead 20 to be lengthened, a sum of a thickness t1 of the upper bond section 211 and a thickness t2 of the lower support section 212 may be greater than a thickness t3 of the bridge portion 23. In some embodiments, the thickness t2 of the lower support section 212 may be substantially equal to the thickness t1 of the upper bond section 211. In some embodiments, the sum of the thicknesses (t1 and t2) of the upper bond section 211 and the lower support section 212 may be substantially equal to a thickness t of the outer lead portion 22, thus, a bottom surface of the inner lead portion 21 is substantially coplanar with a bottom surface of the outer lead portion 22. The thickness t1 of the upper bond section 211 may be substantially equal to the thickness t3 of the bridge portion 23.

The cavity 24 is defined by the outer lead portion 22, the bridge portion 23 and the lower support section 212 of the inner lead portion 21. In some embodiments, a depth D of the cavity 24 may be substantially equal to the thickness t2 of the lower support section 212 and the thickness t3 of the bridge portion 23.

The lower support section 212 may improve the structural strength of the lead 20, thereby allowing the length of the lead 20 to be lengthened, for example, a sum of a length of the inner lead portion 21 and a length of the bridge portion 23 may be lengthened to greater than about 3 mm, about 5 mm, or about 8 mm. In some embodiments, the length of the inner lead portion 21 may be about 1 mm to about 2 mm, and the length of the bridge portion 23 may be about 2 mm. When the lead 20 is to be lengthened, the length of the inner lead portion 21 may be fixed, and the length of the bridge portion 23 may extend to a desired length.

Figure 6:
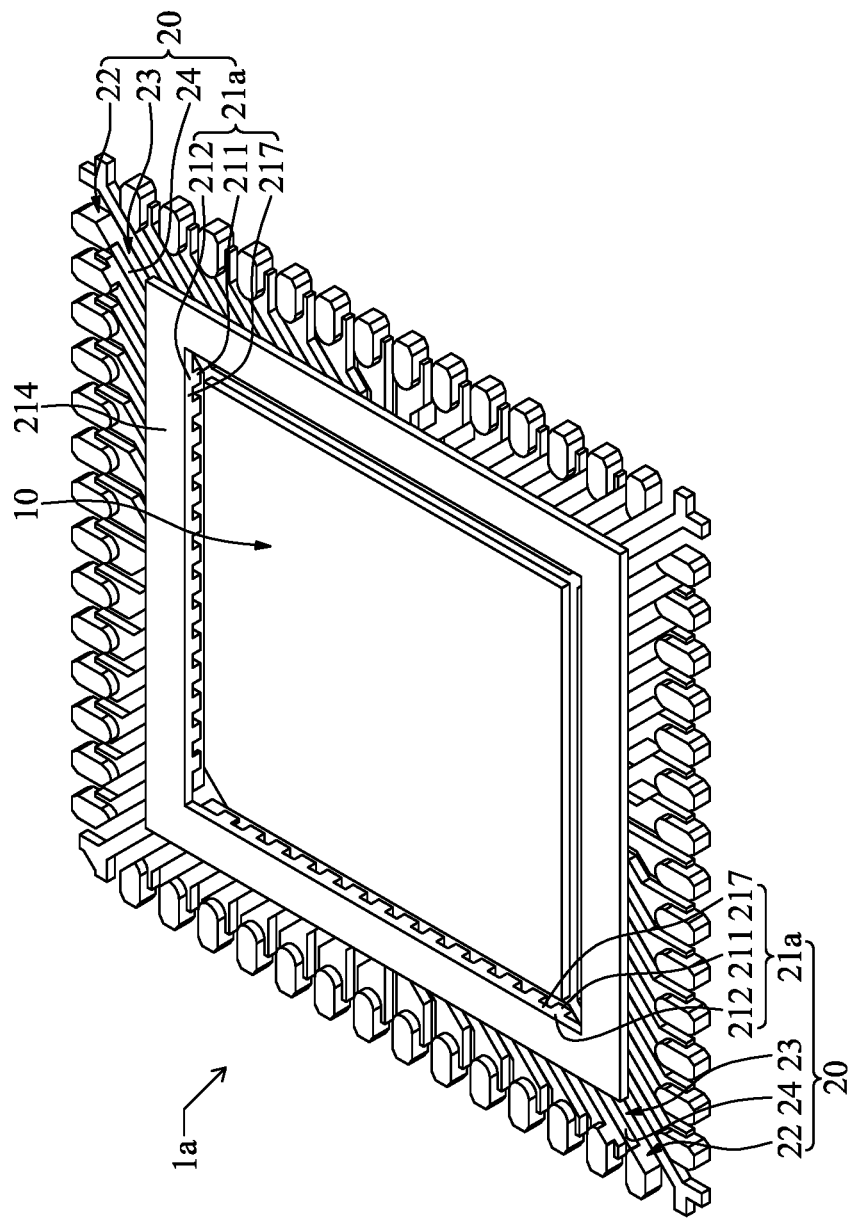
FIG. 6 illustrates a bottom perspective view of a device according to some embodiments of the present disclosure.
Figure 7:
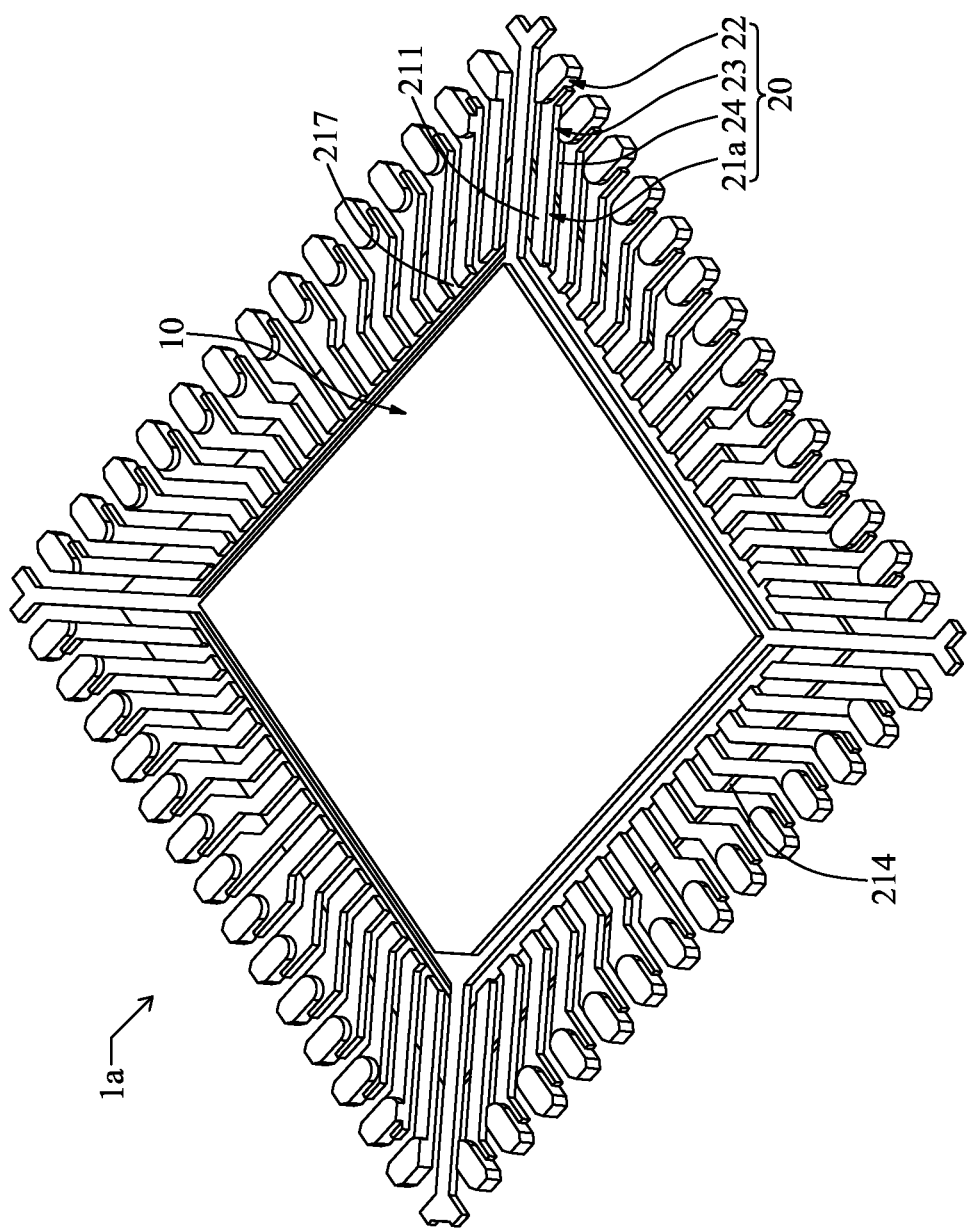
FIG. 7 illustrates a top perspective view of FIG. 6.

FIG. 6 illustrates a bottom perspective view of a device 1a according to some embodiments of the present disclosure. FIG. 7 illustrates a top perspective view of FIG. 6. The device 1a is similar to the device 1 shown in FIG. 3 and FIG. 4, except for the structure of the inner lead portion 21a. The inner lead portion 21a of FIG. 6 further has a connecting section 217 extending from a side of the lower support section 212 and connected to another adjacent lower support section 212, e.g., the connecting section 217 is located between two adjacent lower support sections 212. That is, all of the lower support sections 212 of the inner lead portions 21a are connected to each other through the connecting sections 217, thereby forming a support ring 214. In some embodiments, the lower support sections 212, the upper bond sections 211 and the connecting sections 217 are formed integrally (e.g. and concurrently) as a monolithic structure. In some embodiments, the support ring 214 may be in a square shape, and the support ring 214 has a uniform thickness that may be substantially equal to the thickness t2 of the lower support section 212. Thus, a bottom surface of the support ring 214 is substantially coplanar with the bottom surface of the outer lead portion 22.

Figure 8:
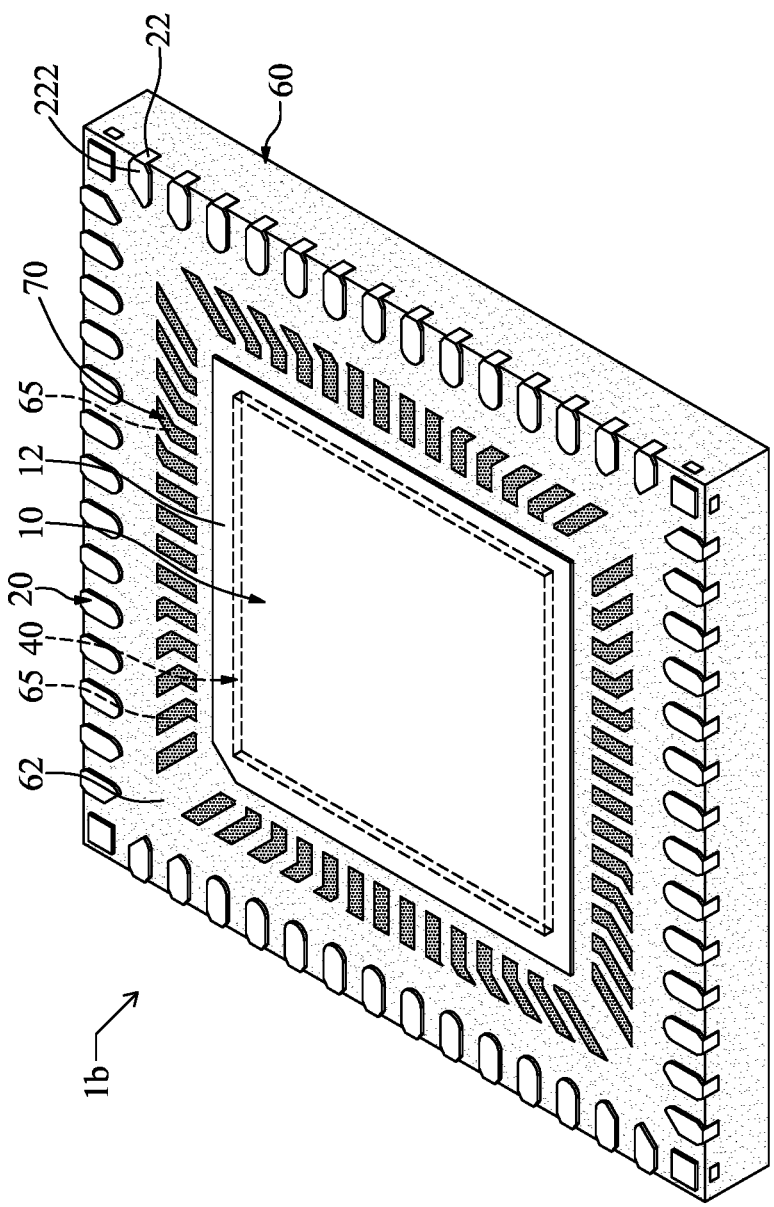
FIG. 8 illustrates a bottom perspective view of a device according to some embodiments of the present disclosure.
Figure 9:
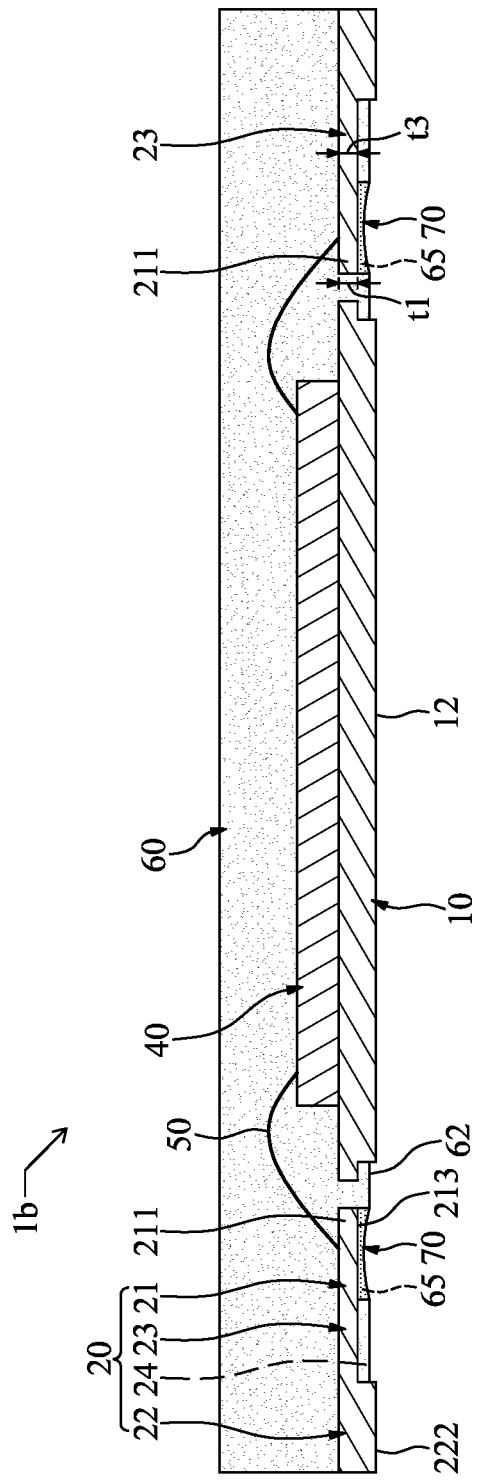
FIG. 9 illustrates a cross-sectional view of the device of FIG. 8.

FIG. 8 illustrates a bottom perspective view of a device 1b according to some embodiments of the present disclosure. FIG. 9 illustrates a cross-sectional view of the device 1b of FIG. 8. The device 1b is a semiconductor device such as a semiconductor package structure. The device 1b is similar to the device 1 shown in FIG. 3, except that the device 1b further includes a semiconductor die 40 disposed on the die paddle 10, a plurality of bonding wires 50 for electrically connecting the semiconductor die 40 and the upper bond section 211 of each of the inner lead portions 21, an encapsulant 60 and a coating 70.

The encapsulant 60 covers the semiconductor die 40, the die paddle 10, the bonding wires 50 and the leads 20, and defines at least one opening 65 on a bottom surface 62 thereof to expose a bottom surface 213 of the upper bond section 211 of the inner lead portion 21. In some embodiments, the bottom surface 213 of the upper bond section 211 may be an etched surface or a rough surface.

In some embodiments, the at least one opening 65 of the encapsulant 60 includes a plurality of openings 65 spaced apart from each other, and each of the upper bond sections 211 of the inner lead portions 21 may be exposed from a respective one of the openings 65. The opening 65 is formed through etching the lower support section 212 of the inner lead portion 21. Thus, the size and the position of the opening 65 is substantially equal to the size and the position of the lower support section 212 of the inner lead portion 21.

The coating 70 is disposed in the opening 65 to cover the bottom surface 213 of the upper bond section 211 of the inner lead portion 21. In some embodiments, the coating 70 may be recessed from the bottom surface 62 of the encapsulant 60, and a material of the coating 70 may be different from a material of the encapsulant 60. A bottom surface of the coating 70 may be a curved surface. The constituent of the coating 70 may include resin, colorant (in color of black or green), photoinitiator, additives (for example, antifoamer and leveling agent) and solvent. In addition, the material properties of the coating 70 may include a viscosity of about 15.0 mPa·s, a specific gravity of about 1.0 and a surface tension of about 24 to 26 mN/m. In some embodiments, the coating 70 may be a UV curable coating.

In some embodiments, a thickness of the coating 70 may be less than the thickness t1 of the upper bond section 211 and the thickness t3 of the bridge portion 23. In some embodiments, the thickness of the coating 70 may be substantially equal to the thickness t1 of the upper bond section 211 and the thickness t3 of the bridge portion 23, thus, a bottom surface of the coating 70 may be substantially coplanar with the bottom surface 62 of the encapsulant 60.

Figure 10:
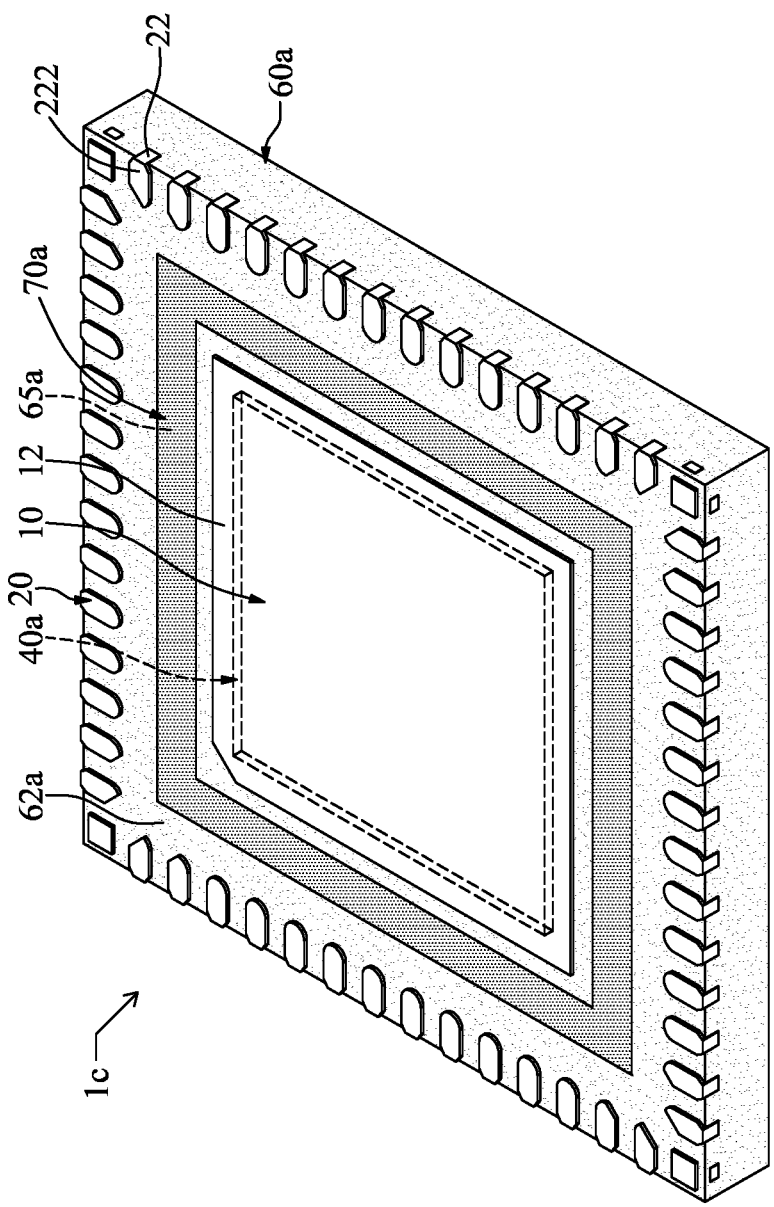
FIG. 10 illustrates a bottom perspective view of a device according to some embodiments of the present disclosure.
Figure 11:
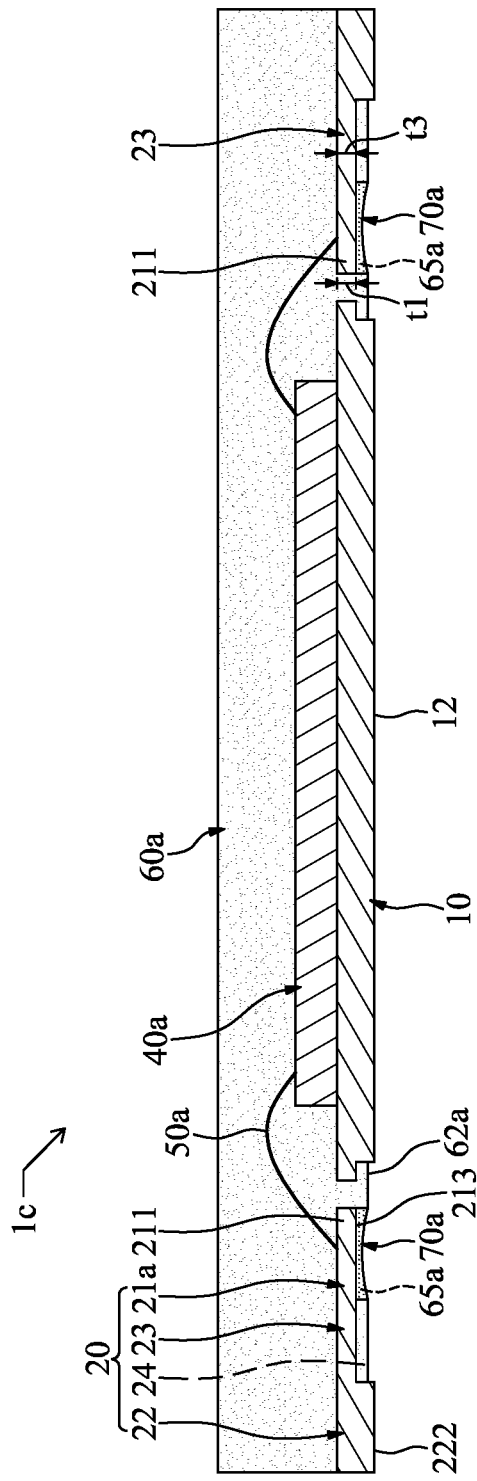
FIG. 11 illustrates a cross-sectional view of the device of FIG. 10.

FIG. 10 illustrates a bottom perspective view of a device 1c according to some embodiments of the present disclosure. FIG. 11 illustrates a cross-sectional view of the device 1c of FIG. 10. The device 1c is a semiconductor device such as a semiconductor package structure. The device 1c is similar to the device 1a shown in FIG. 6, except that the device 1c further includes a semiconductor die 40a disposed on the die paddle 10, a plurality of bonding wires 50a for electrically connecting the semiconductor die 40a and the upper bond section 211 of each of the inner lead portions 21a, an encapsulant 60a and a coating 70a.

The encapsulant 60a covers the semiconductor die 40a, the die paddle 10, the bonding wires 50a and the leads 20, and defines a ring-shaped opening 65a on a bottom surface 62a thereof to expose bottom surfaces 213 of the upper bond sections 211 of the inner lead portions 21a. In some embodiments, the bottom surface 213 of the upper bond section 211 may be an etched surface or a rough surface. In some embodiments, the ring-shaped opening 65a is in a square shape. The opening 65a is formed through etching the support ring 214 (FIG. 6). Thus, the size and the position of the ring-shaped opening 65a is substantially equal to the size and the position of the support ring 214 (FIG. 6).

The coating 70a is disposed in the ring-shaped opening 65a to cover the bottom surfaces 213 of the upper bond sections 211 of the inner lead portions 21a and surrounds the die paddle 10. In some embodiments, the coating 70a may be recessed from the bottom surface 62a of the encapsulant 60a, and a material of the coating 70a may be different from a material of the encapsulant 60a. A bottom surface of the coating 70a may be a curved surface.

In some embodiments, a thickness of the coating 70a may be less than the thickness t1 of the upper bond section 211 and the thickness t3 of the bridge portion 23. In some embodiments, the thickness of the coating 70a may be substantially equal to the thickness t1 of the upper bond section 211 and the thickness t3 of the bridge portion 23, thus, a bottom surface of the coating 70a may be substantially coplanar with the bottom surface 62a of the encapsulant 60a.

FIG. 12 through FIG. 15 illustrate a method for manufacturing a device according to some embodiments of the present disclosure. In some embodiments, the method is for manufacturing a device such as the device 1 shown in FIG. 1 through FIG. 4.

Figure 12:
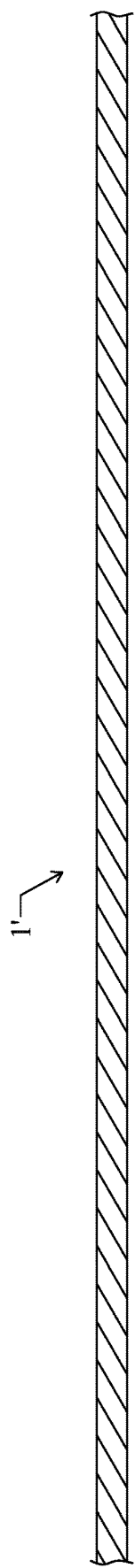
FIG. 12 illustrates one or more stages of an example of a method for manufacturing a device according to some embodiments of the present disclosure.
Figure 13:
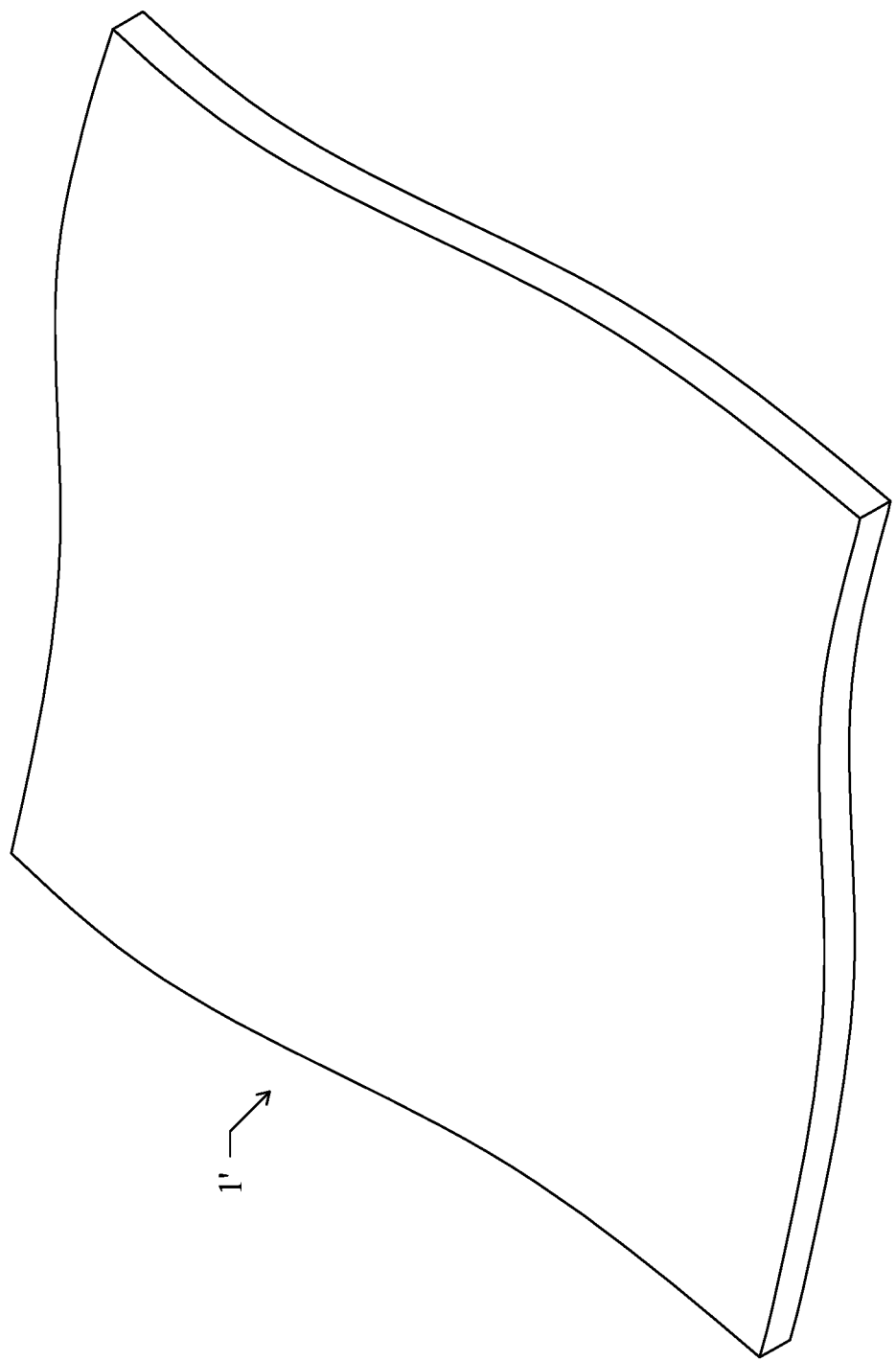
FIG. 13 illustrates one or more stages of an example of a method for manufacturing a device according to some embodiments of the present disclosure.

Referring to FIG. 12 and FIG. 13, a metal plate 1' is provided. In some embodiments, the metal plate 1' may be a copper plate.

Figure 14:
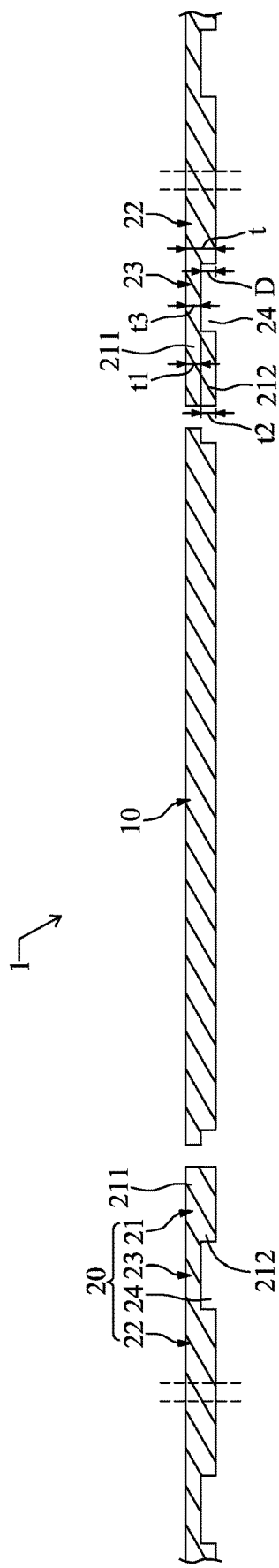
FIG. 14 illustrates one or more stages of an example of a method for manufacturing a device according to some embodiments of the present disclosure.
Figure 15:
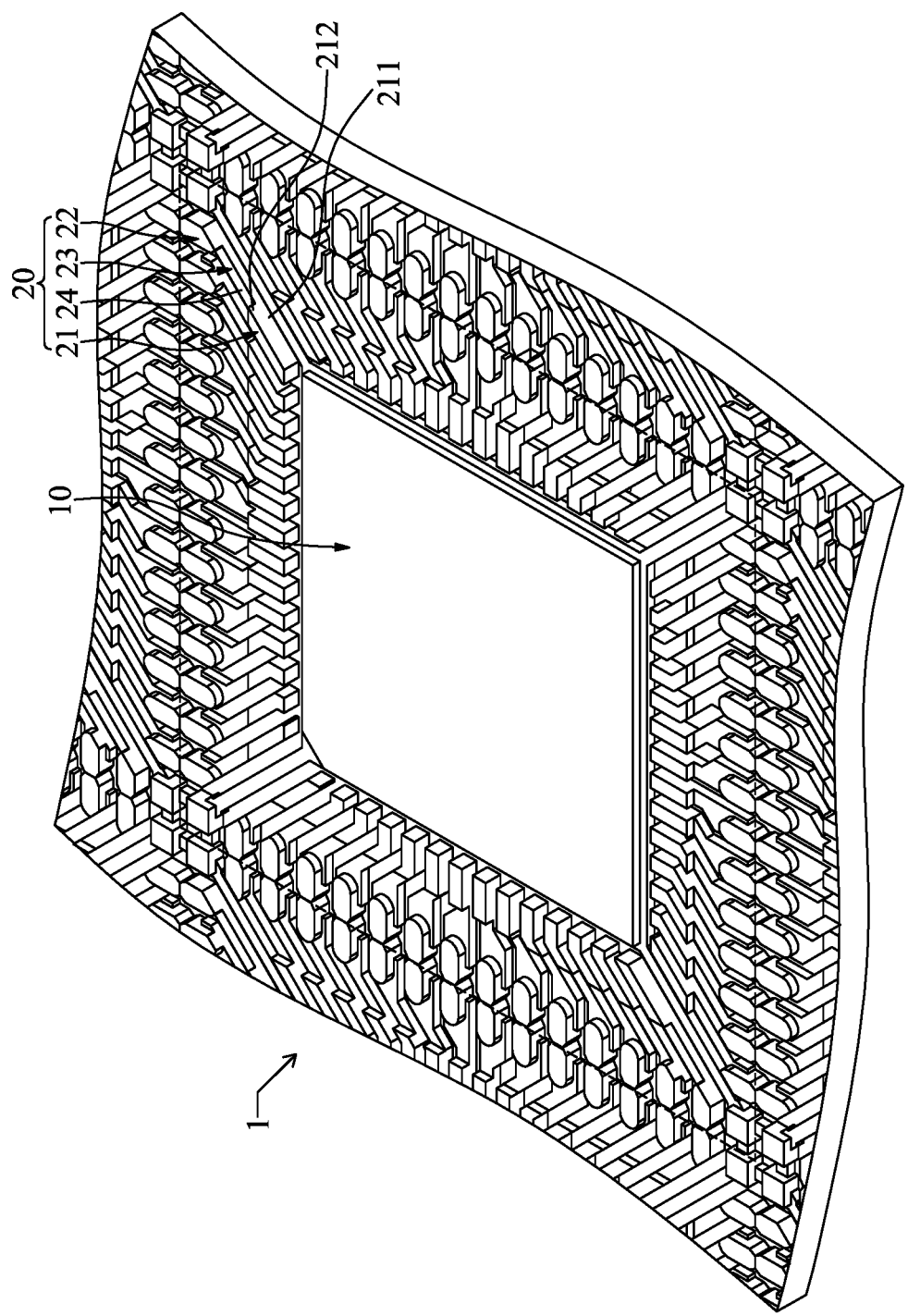
FIG. 15 illustrates one or more stages of an example of a method for manufacturing a device according to some embodiments of the present disclosure.

Referring to FIG. 12, FIG. 14 and FIG. 15, the metal plate 1' is etched to form a lead frame 9. The lead frame 9 includes a plurality of devices 1 (e.g., lead frame units) arranged in an array. Each of the devices 1 includes a die paddle 10 and a plurality of leads 20 surrounding the die paddle 10. Each of the leads 20 includes an inner lead portion 21, an outer lead portion 22 and a bridge portion 23 between the inner lead portion 21 and the outer lead portion 22. The inner lead portion 21 is adjacent to and is spaced apart from the die paddle 10. The inner lead portion 21 has an upper bond section 211 connected to the bridge portion 23 and a lower support section 212 below the upper bond section 211. It is noted that a sum of a thickness t1 of the upper bond section 211 and a thickness t2 of the lower support section 212 is greater than a thickness t3 of the bridge portion 23.

In some embodiments, the bridge portions 23 are formed through a half-etching process, and a cavity 24 is formed together with the bridge portions 23 during the half-etching process. The cavity 24 is formed between the outer lead portion 22 and the lower support section 212 of the inner lead portion 21. That is, the cavity 24 is defined by the outer lead portion 22, the bridge portion 23 and the lower support section 212 of the inner lead portion 21. In some embodiments, a depth D of the cavity 24 may be substantially equal to the thickness t2 of the lower support section 212 and the thickness t3 of the bridge portion 23.

Figure 16:
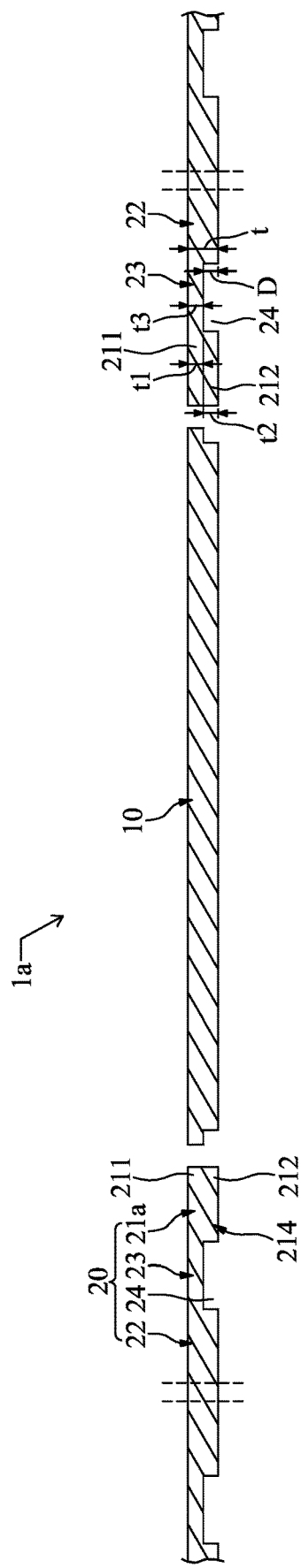
FIG. 16 illustrates one or more stages of an example of a method for manufacturing a device according to some embodiments of the present disclosure.
Figure 17:
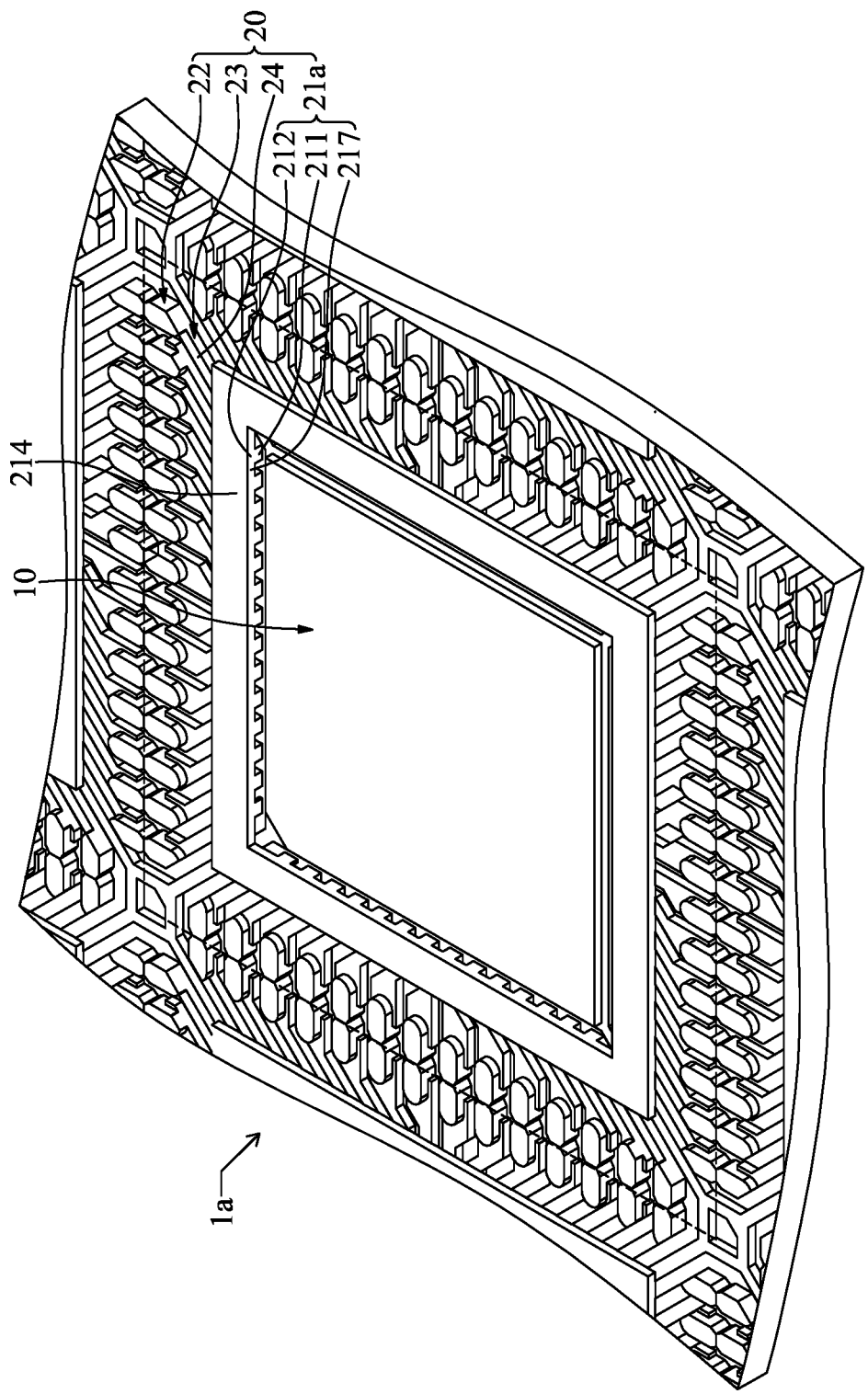
FIG. 17 illustrates one or more stages of an example of a method for manufacturing a device according to some embodiments of the present disclosure.

FIG. 16 through FIG. 17 illustrate a method for manufacturing a device according to some embodiments of the present disclosure. In some embodiments, the method is for manufacturing a device such as the device 1a shown in FIG. 6. The initial stage of the illustrated process is the same as, or similar to, the stage illustrated in FIG. 12 and FIG. 13. FIG. 16 and FIG. 17 depict a stage subsequent to that depicted in FIG. 12 and FIG. 13.

Referring to FIG. 16 and FIG. 17, the metal plate 1' is etched to form a lead frame. The lead frame includes a plurality of devices 1a (e.g., lead frame units) arranged in an array. Each of the devices 1a includes a die paddle 10 and a plurality of leads 20 surrounding the die paddle 10. Each of the leads 20 includes an inner lead portion 21a, an outer lead portion 22 and a bridge portion 23 between the inner lead portion 21a and the outer lead portion 22. The inner lead portion 21a is adjacent to and is spaced apart from the die paddle 10. The inner lead portion 21a has an upper bond section 211 connected to the bridge portion 23, a lower support section 212 below the upper bond section 211 and a connecting section 217 extending from a side of the lower support section 212 and connected to another adjacent lower support section 212. That is, the connecting section 217 is located between two adjacent lower support sections 212, and all of the lower support sections 212 of the inner lead portions 21a are connected to each other through the connecting sections 217, thereby forming a support ring 214.

In some embodiments, the support ring 214 may be in a square shape, and the support ring 214 has a uniform thickness that may be substantially equal to the thickness t2 of the lower support section 212.

Figure 18:
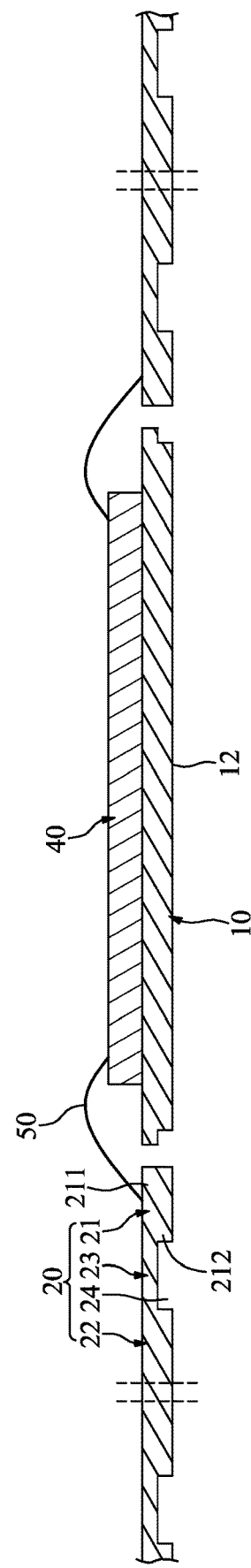
FIG. 18 illustrates one or more stages of an example of a method for manufacturing a device according to some embodiments of the present disclosure.
Figure 19:
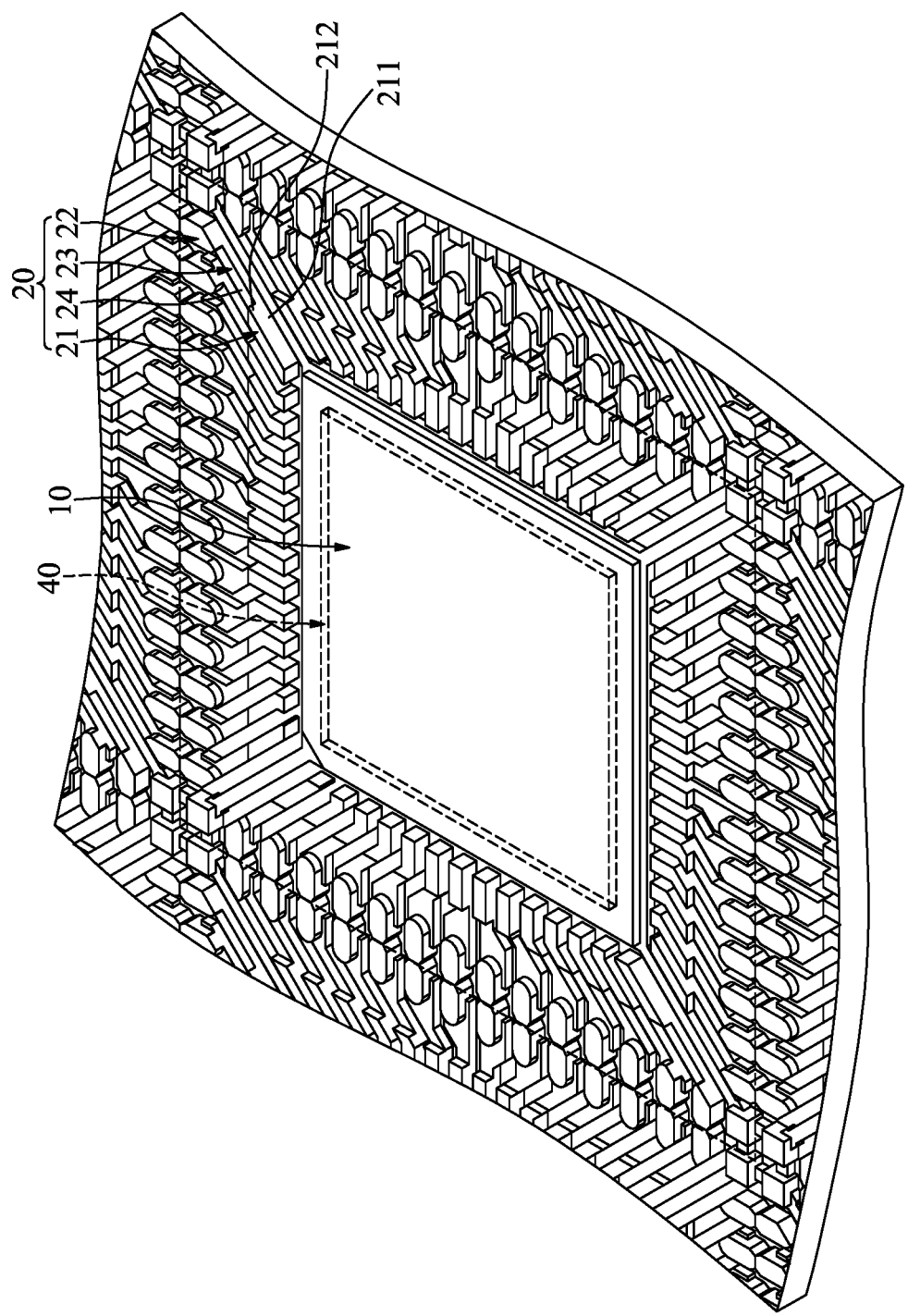
FIG. 19 illustrates one or more stages of an example of a method for manufacturing a device according to some embodiments of the present disclosure.

FIG. 18 through FIG. 26 illustrate a method for manufacturing a device according to some embodiments of the present disclosure. In some embodiments, the method is for manufacturing a device such as the device 1b shown in FIG. 8. The initial several stages of the illustrated process are the same as, or similar to, the stages illustrated in FIG. 12 through FIG. 15 for manufacturing the device 1 of FIG. 1 through FIG. 4. FIG. 18 and FIG. 19 depict a stage subsequent to that depicted in FIG. 14 and FIG. 15.

Referring to FIG. 18 and FIG. 19, a semiconductor die 40 is disposed on the die paddle 10, and a plurality of bonding wires 50 electrically connect the semiconductor die 40 and the upper bond sections 211 of the inner lead portions 21.

Figure 20:
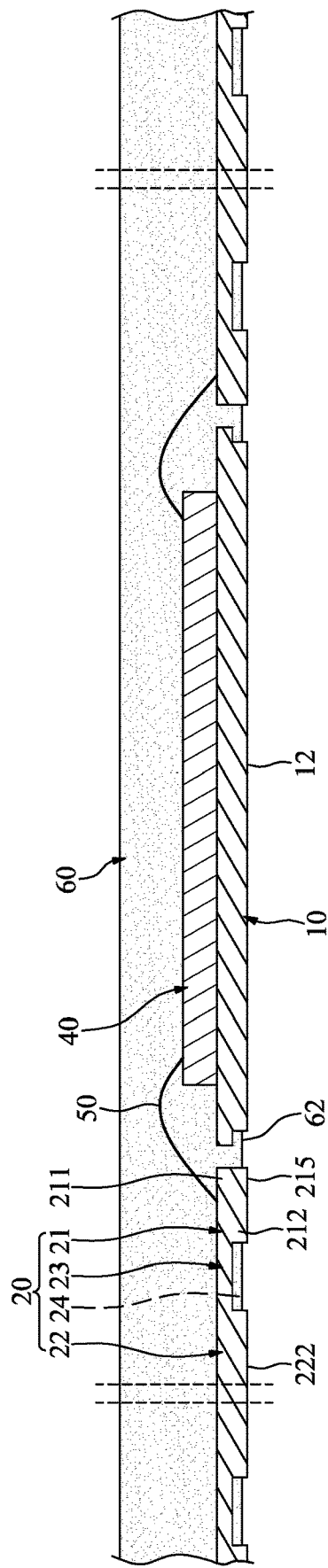
FIG. 20 illustrates one or more stages of an example of a method for manufacturing a device according to some embodiments of the present disclosure.
Figure 21:
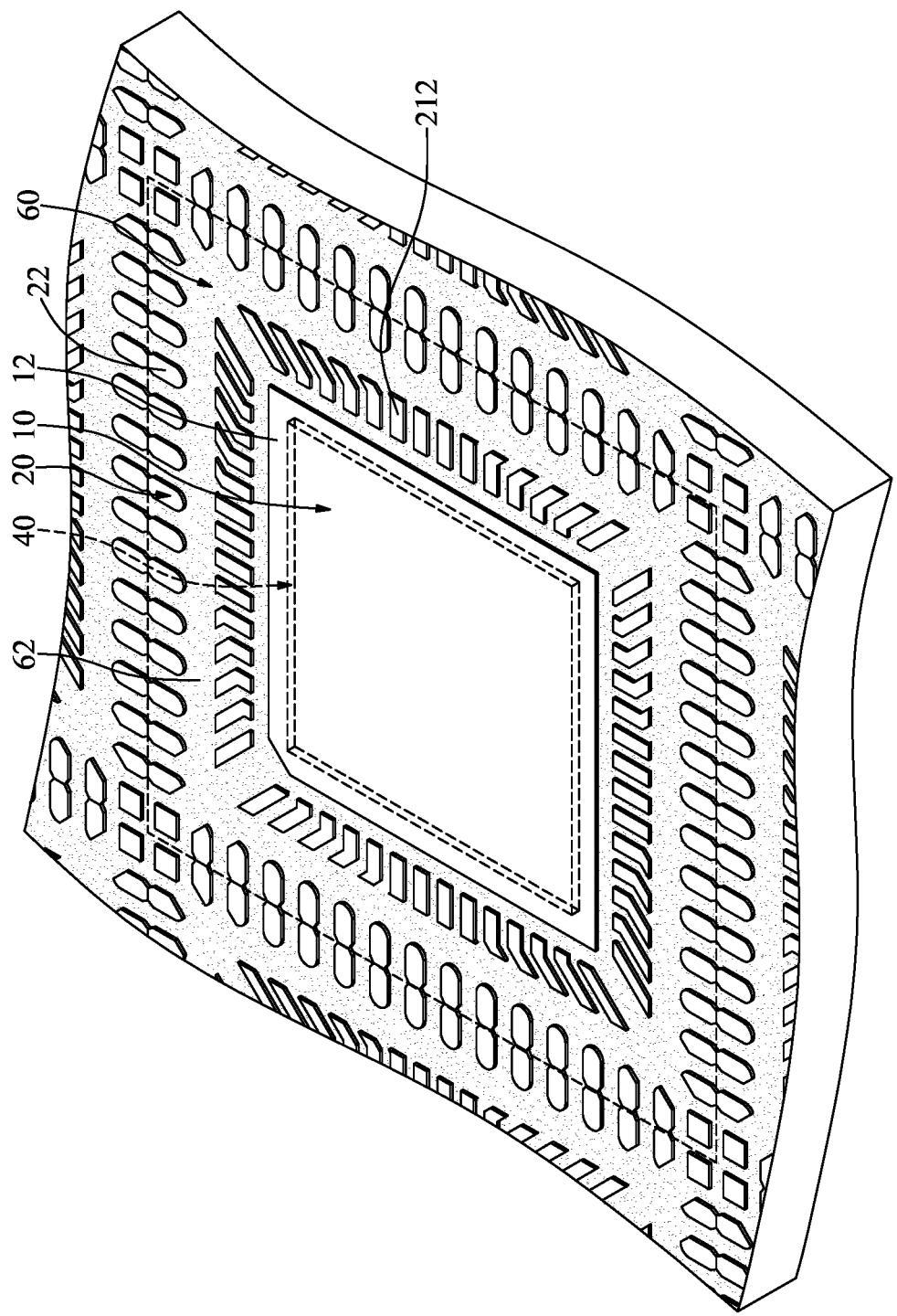
FIG. 21 illustrates one or more stages of an example of a method for manufacturing a device according to some embodiments of the present disclosure.

Referring to FIG. 20 and FIG. 21, an encapsulant 60 is formed to cover the semiconductor die 40, the die paddle 10, the bonding wires 50 and the leads 20, and exposes a bottom surface 215 of the lower support section 212 of each of the inner lead portions 21, a bottom surface 12 of the die paddle 10 and a bottom surface 222 of each of the outer lead portions 22. In some embodiments, the bottom surface 215 of the lower support section 212, the bottom surface 12 of the die paddle 10 and the bottom surface 222 of each of the outer lead portions 22 protrude from a bottom surface 62 of the encapsulant 60.

Figure 22:
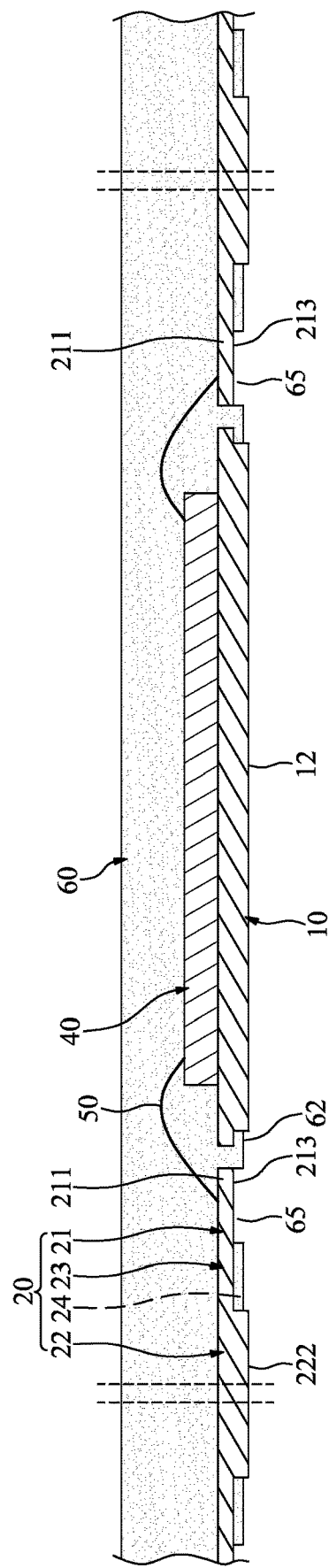
FIG. 22 illustrates one or more stages of an example of a method for manufacturing a device according to some embodiments of the present disclosure.
Figure 23:
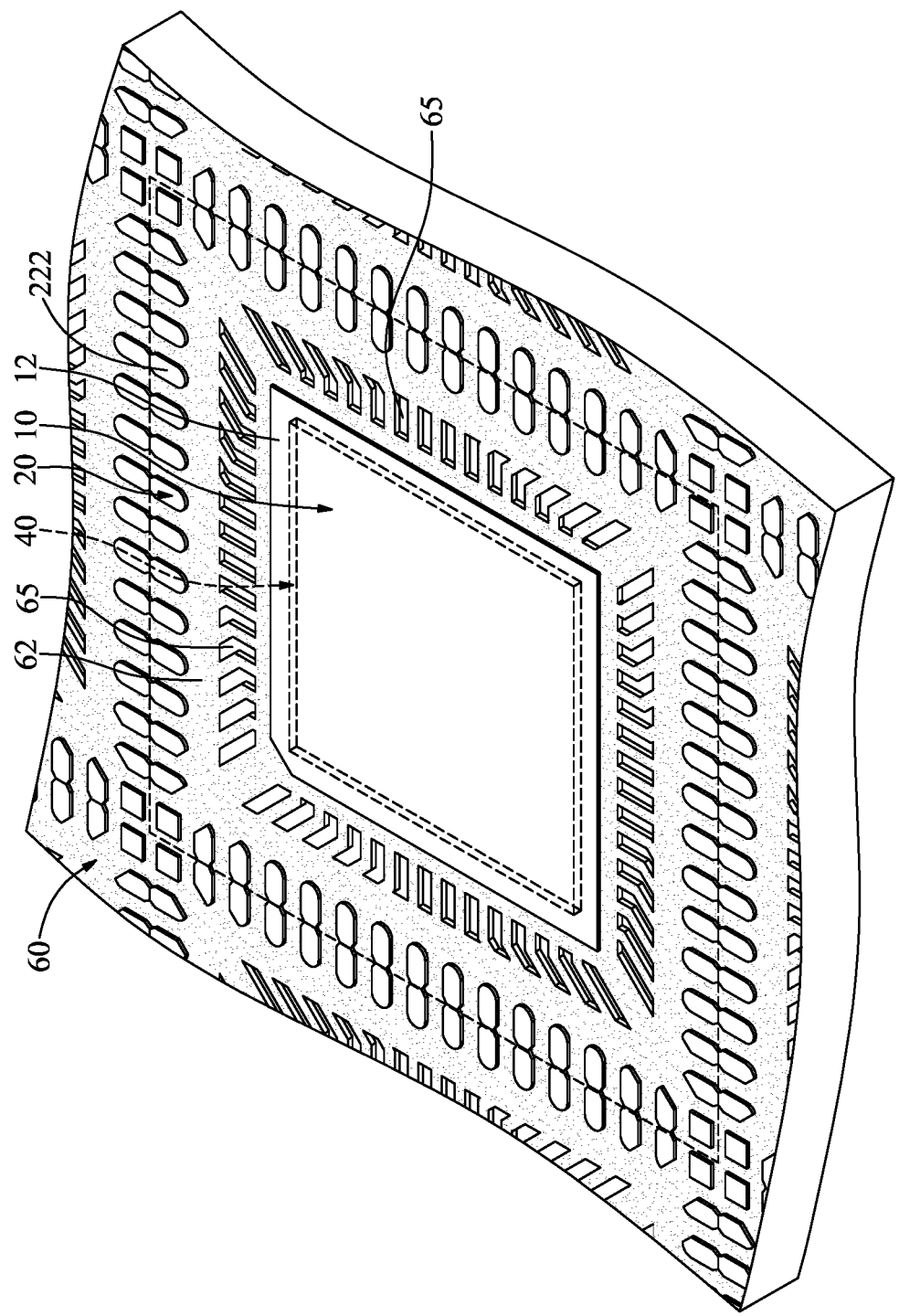
FIG. 23 illustrates one or more stages of an example of a method for manufacturing a device according to some embodiments of the present disclosure.

Referring to FIG. 20, FIG. 22 and FIG. 23, the lower support section 212 of each of the inner lead portions 21 is removed to form a plurality of openings 65 on the bottom surface 62 of the encapsulant 60 and to expose bottom surfaces 213 of the upper bond sections 211 of the inner lead portions 21. In some embodiments, the lower support sections 212 of the inner lead portions 21 may be removed through a half-etching process. In addition, the openings 65 are spaced apart from each other.

Figure 24:
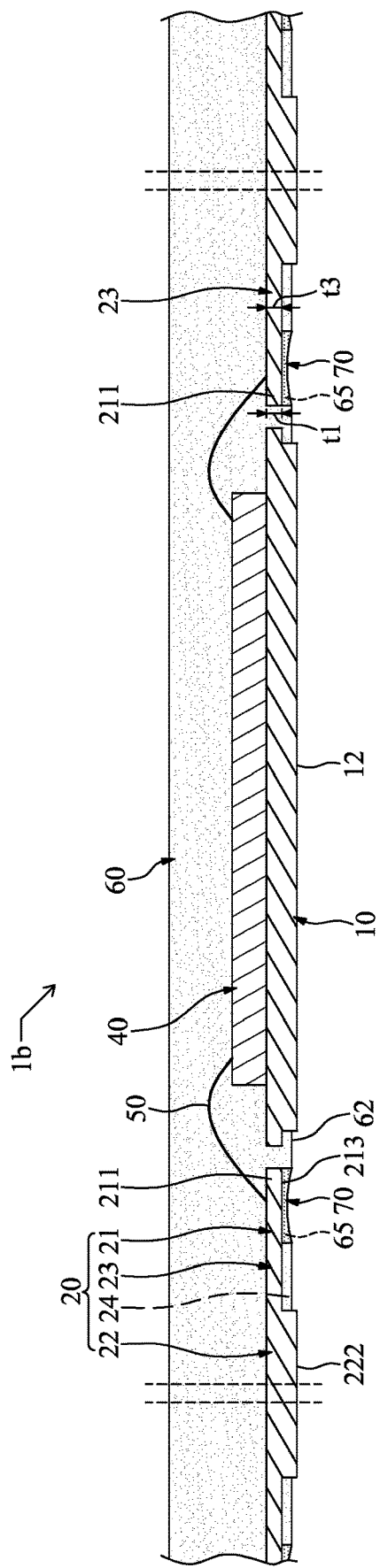
FIG. 24 illustrates one or more stages of an example of a method for manufacturing a device according to some embodiments of the present disclosure.
Figure 25:
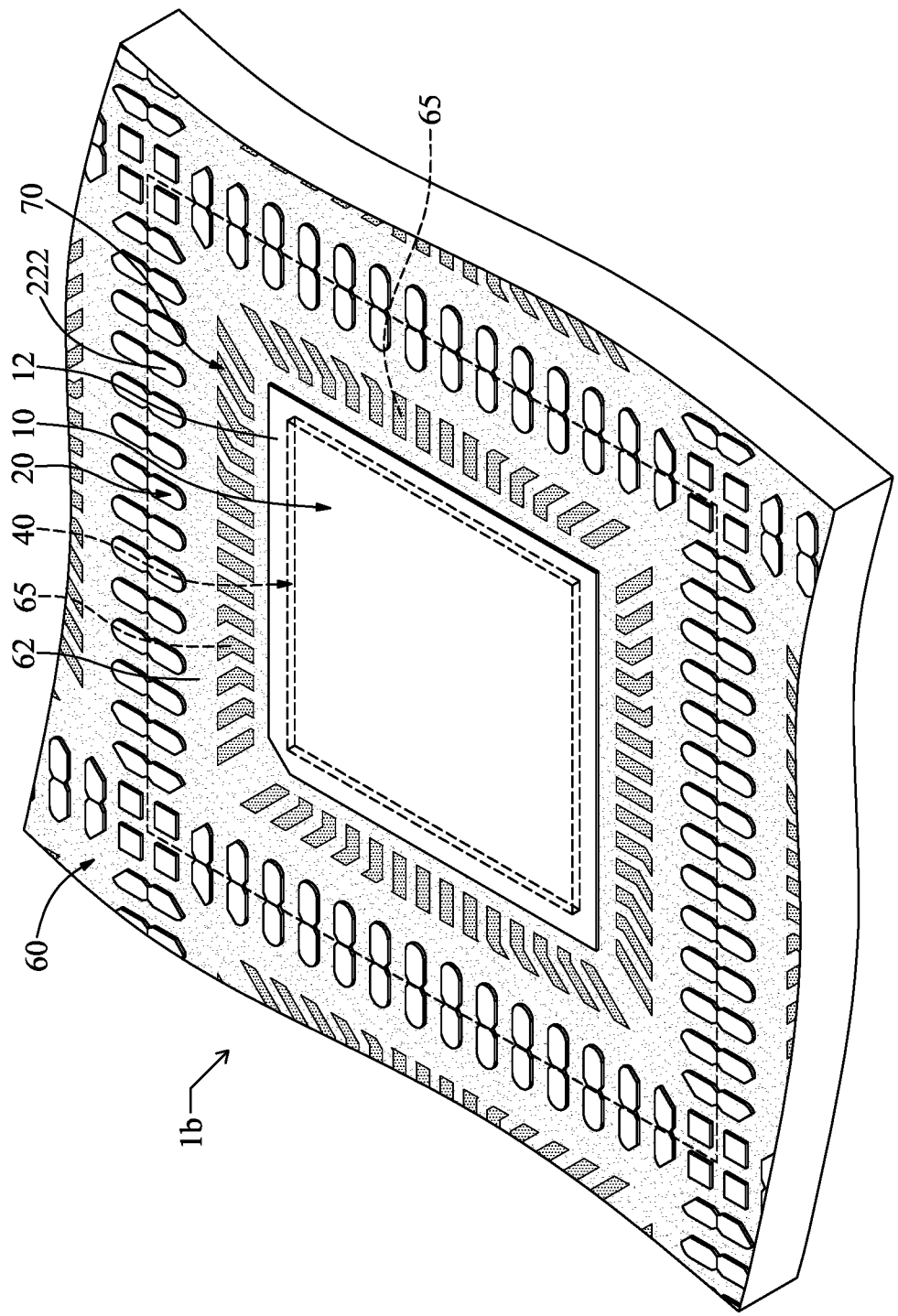
FIG. 25 illustrates one or more stages of an example of a method for manufacturing a device according to some embodiments of the present disclosure.

Referring to FIG. 24 and FIG. 25, a coating 70 is formed in each of the openings 65 to cover the bottom surfaces 213 of the upper bond sections 211 of the inner lead portions 21. In some embodiments, the coating 70 may be recessed from the bottom surface 62 of the encapsulant 60, and a material of the coating 70 may be different from a material of the encapsulant 60.

Figure 26:
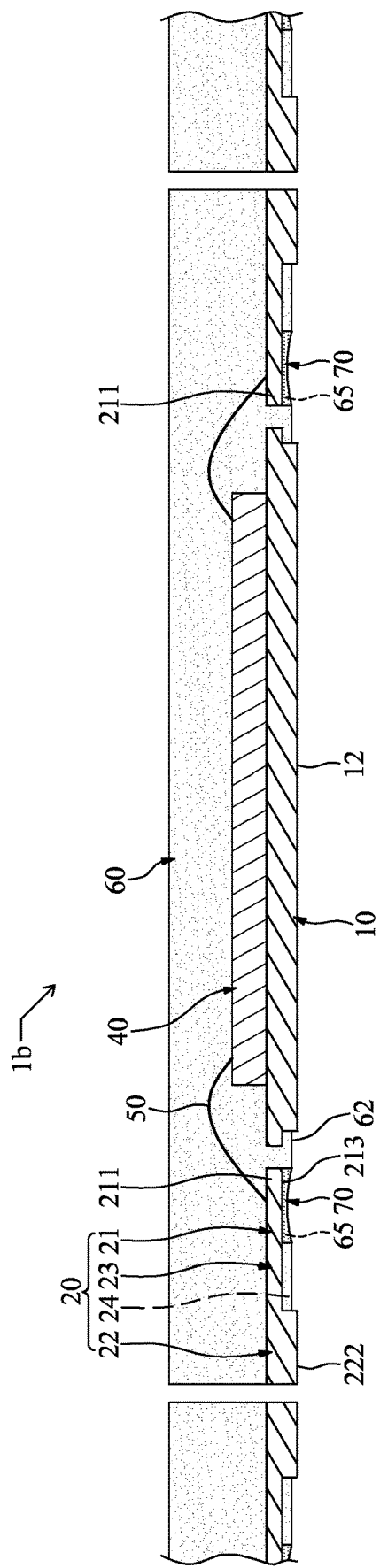
FIG. 26 illustrates one or more stages of an example of a method for manufacturing a device according to some embodiments of the present disclosure.

Referring to FIG. 24, FIG. 25 and FIG. 26, a singulation process is conducted to obtain a plurality of devices 1b of FIG. 8.

Figure 27:
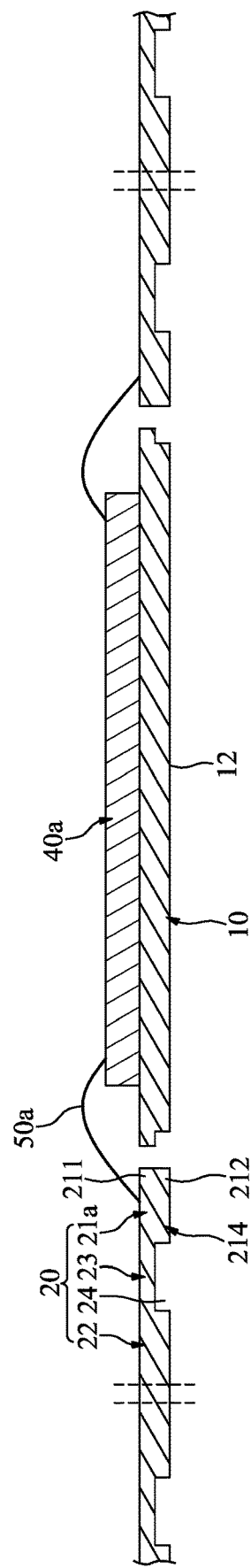
FIG. 27 illustrates one or more stages of an example of a method for manufacturing a device according to some embodiments of the present disclosure.
Figure 28:
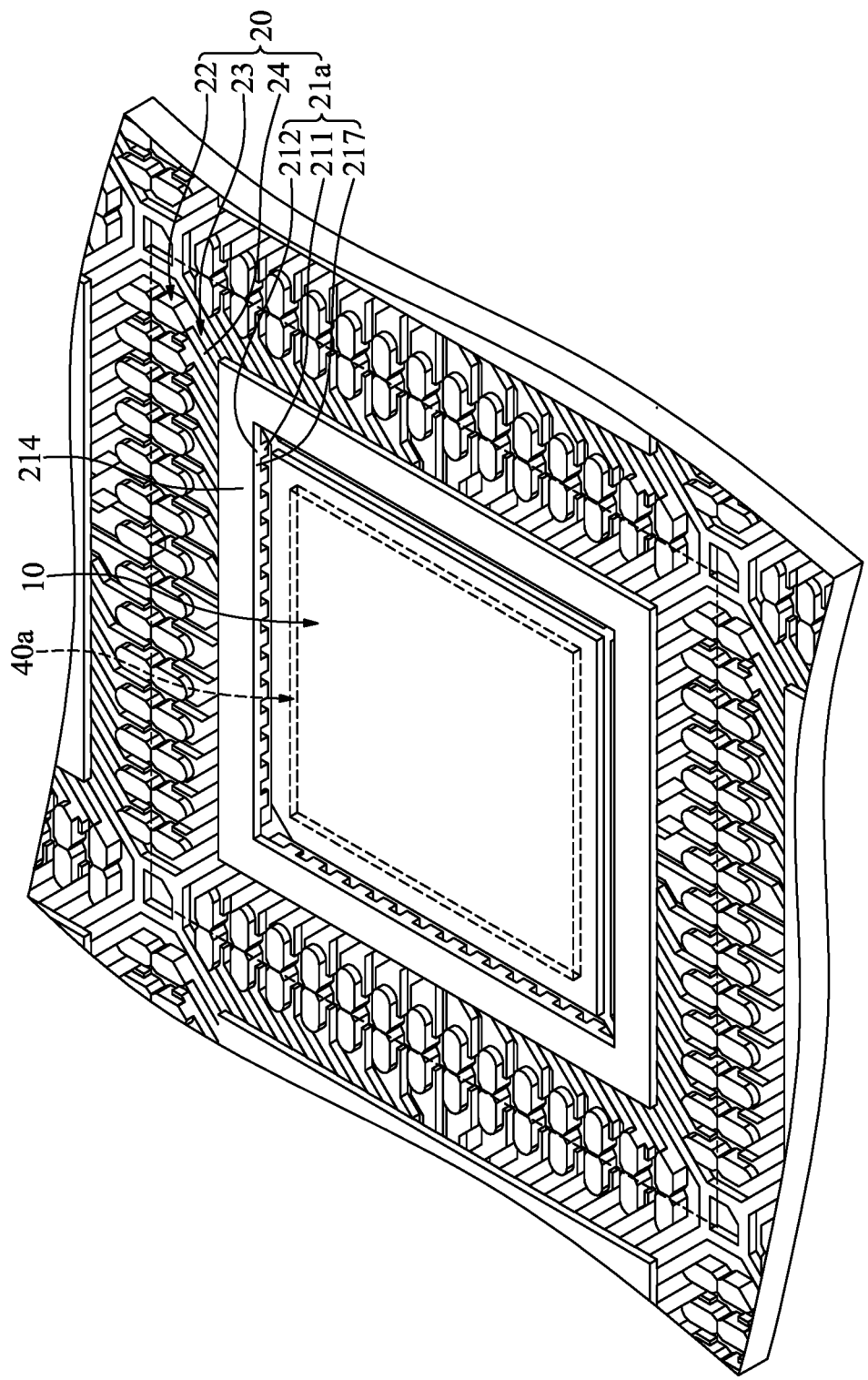
FIG. 28 illustrates one or more stages of an example of a method for manufacturing a device according to some embodiments of the present disclosure.

FIG. 27 through FIG. 35 illustrate a method for manufacturing a device according to some embodiments of the present disclosure. In some embodiments, the method is for manufacturing a device such as the device 1c shown in FIG. 10. The initial several stages of the illustrated process are the same as, or similar to, the stages illustrated in FIG. 12 through FIG. 13 and FIG. 16 through FIG. 17 for manufacturing the device 1a shown in FIG. 6. FIG. 27 and FIG. 28 depict a stage subsequent to that depicted in FIG. 16 and FIG. 17.

Referring to FIG. 27 and FIG. 28, a semiconductor die 40a is disposed on the die paddle 10, and a plurality of bonding wires 50a electrically connect the semiconductor die 40a and the upper bond sections 211 of the inner lead portions 21a.

Figure 29:
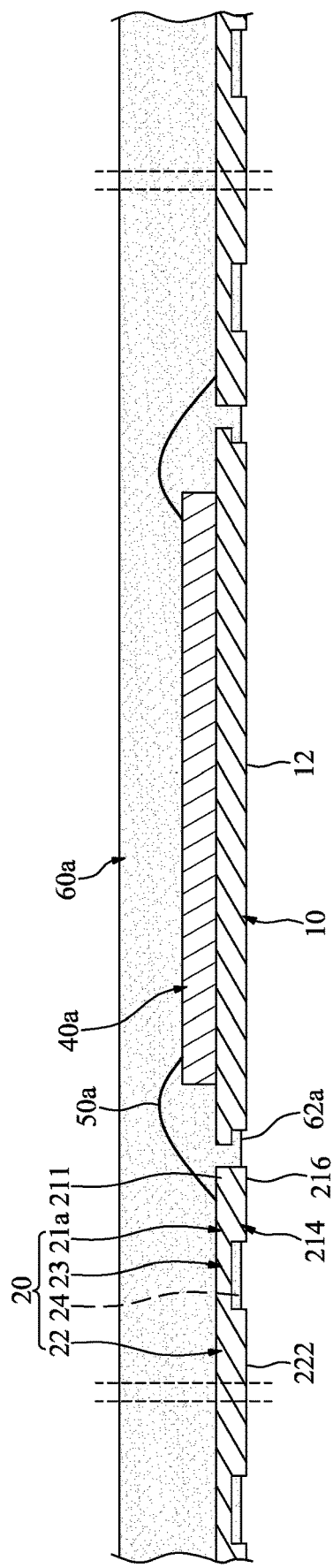
FIG. 29 illustrates one or more stages of an example of a method for manufacturing a device according to some embodiments of the present disclosure.
Figure 30:
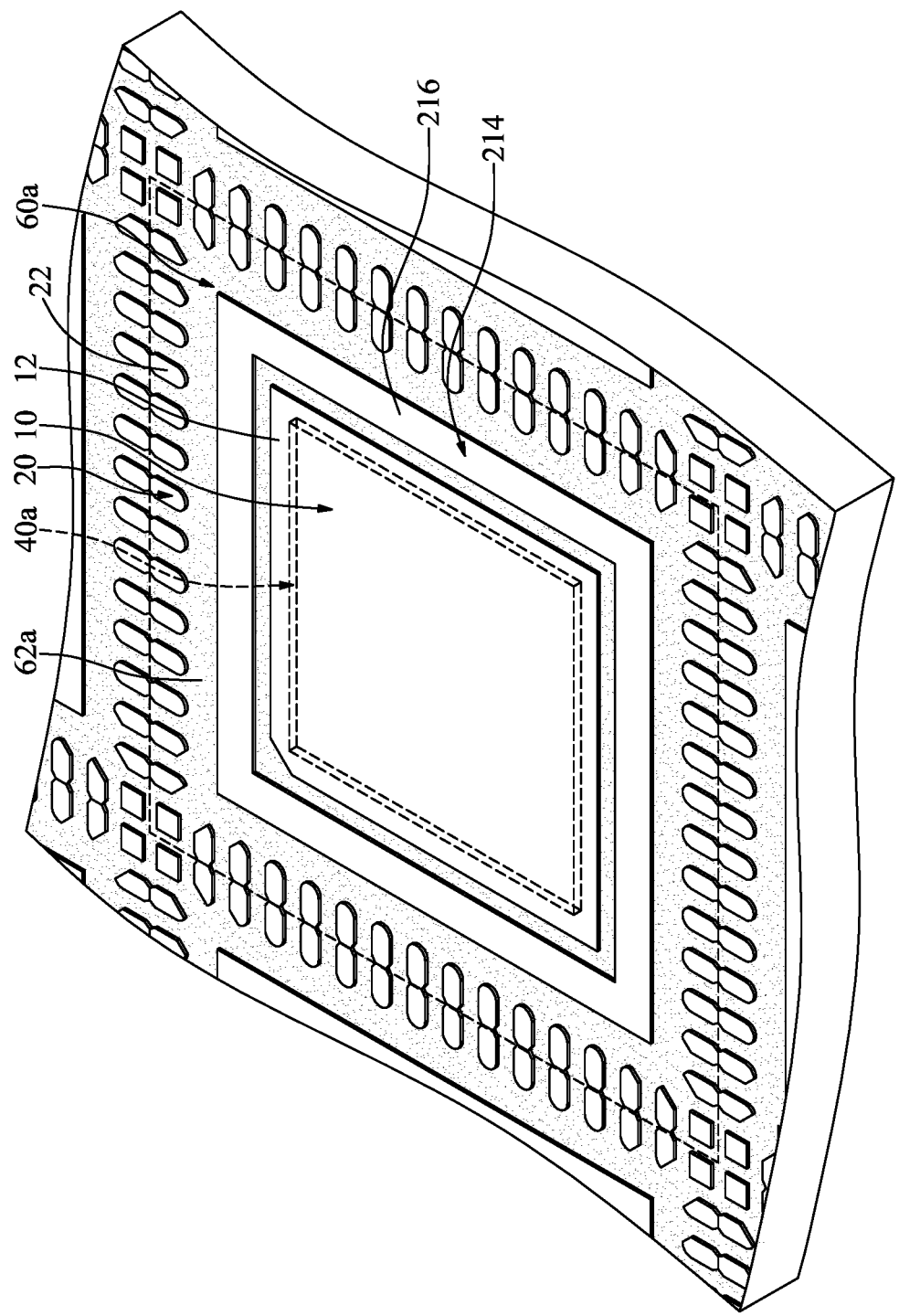
FIG. 30 illustrates one or more stages of an example of a method for manufacturing a device according to some embodiments of the present disclosure.

Referring to FIG. 29 and FIG. 30, an encapsulant 60a is formed to cover the semiconductor die 40a, the die paddle 10, the bonding wires 50a and the leads 20, and exposes a bottom surface 216 of the support ring 214, a bottom surface 12 of the die paddle 10 and a bottom surface 222 of each of the outer lead portions 22. In some embodiments, the bottom surface 216 of the support ring 214, the bottom surface 12 of the die paddle 10 and the bottom surface 222 of each of the outer lead portions 22 protrude from a bottom surface 62a of the encapsulant 60a.

Figure 31:
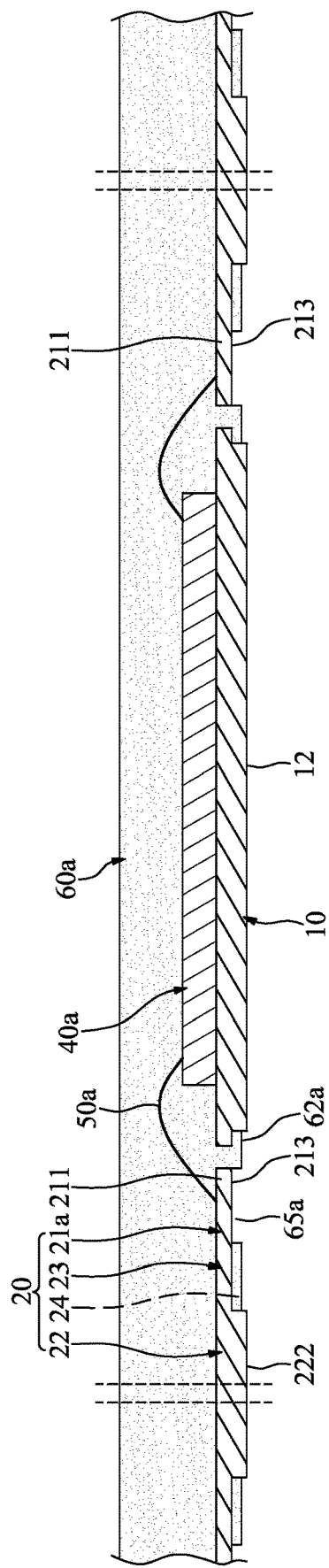
FIG. 31 illustrates one or more stages of an example of a method for manufacturing a device according to some embodiments of the present disclosure.
Figure 32:
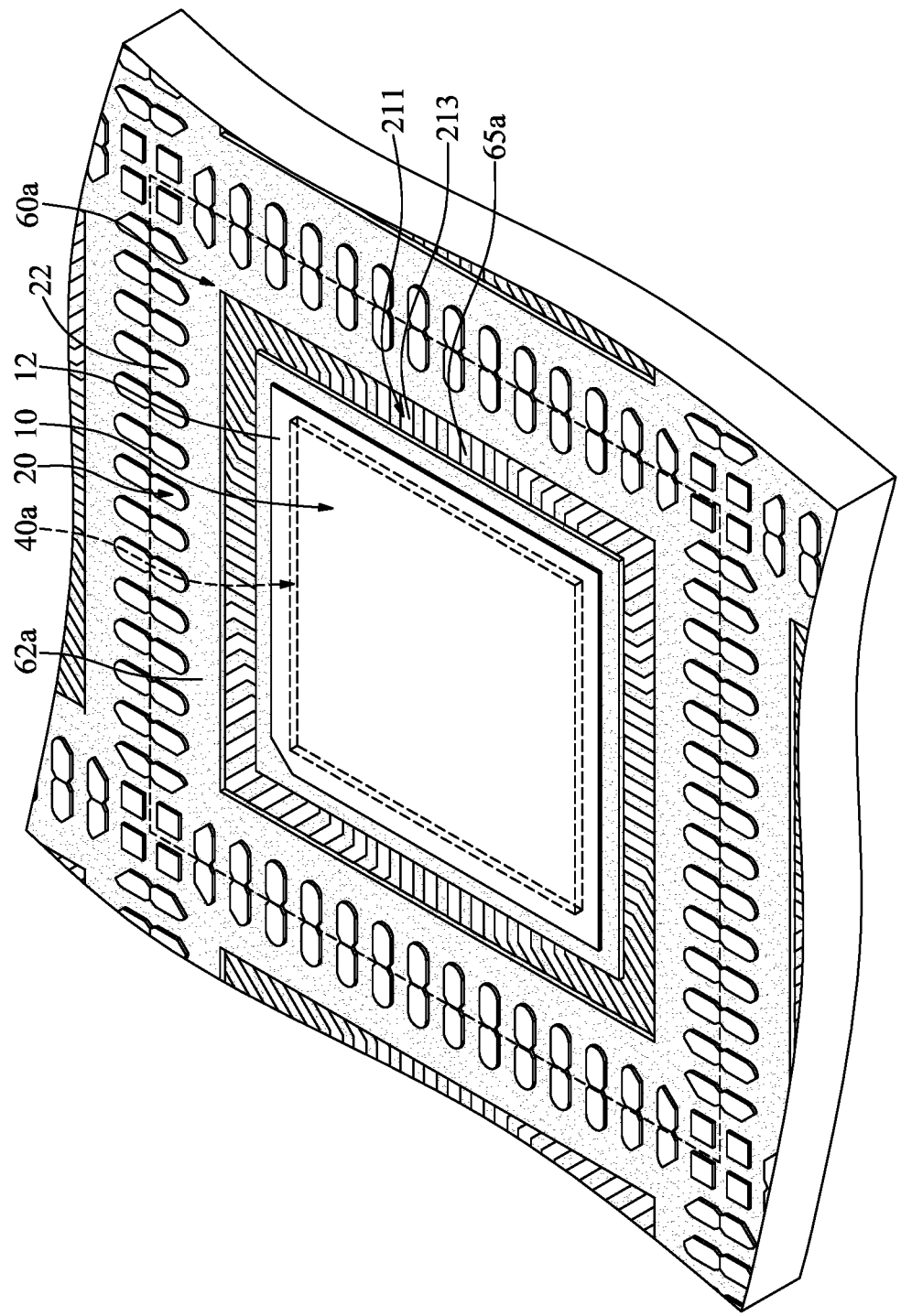
FIG. 32 illustrates one or more stages of an example of a method for manufacturing a device according to some embodiments of the present disclosure.

Referring to FIG. 29, FIG. 31 and FIG. 32, the support ring 214 is removed to form a ring-shaped opening 65a on the bottom surface 62a of the encapsulant 60a and to expose bottom surfaces 213 of the upper bond sections 211 of the inner lead portions 21a. In some embodiments, the support ring 214 may be removed through a half-etching process.

Figure 33:
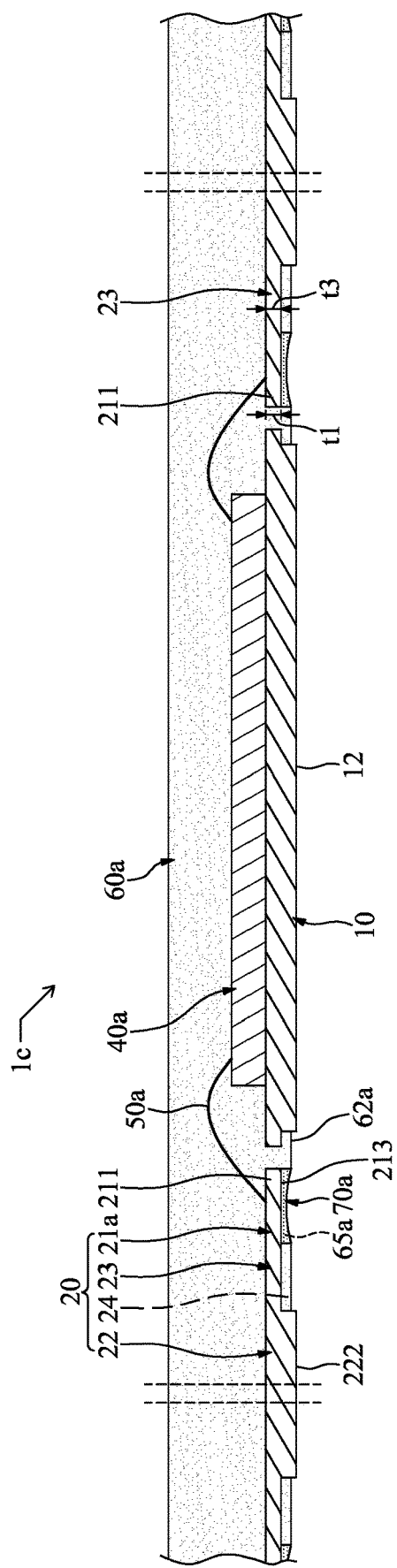
FIG. 33 illustrates one or more stages of an example of a method for manufacturing a device according to some embodiments of the present disclosure.
Figure 34:
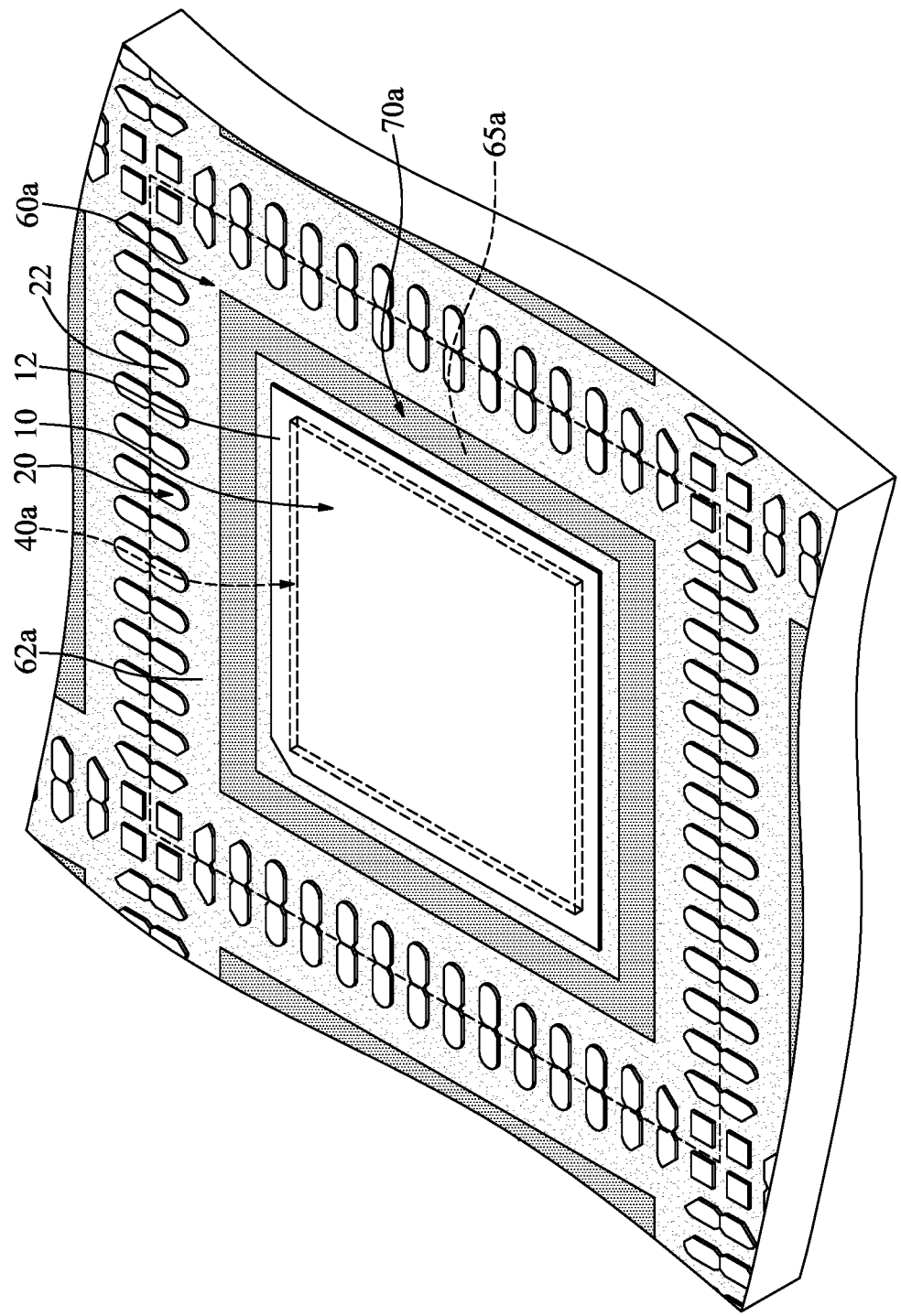
FIG. 34 illustrates one or more stages of an example of a method for manufacturing a device according to some embodiments of the present disclosure.

Referring to FIG. 33 and FIG. 34, a coating 70a is formed in the ring-shaped opening 65a to cover the bottom surfaces 213 of the upper bond sections 211 of the inner lead portions 21a. In some embodiments, the coating 70a may be recessed from the bottom surface 62a of the encapsulant 60a, and a material of the coating 70a may be different from a material of the encapsulant 60a.

Figure 35:
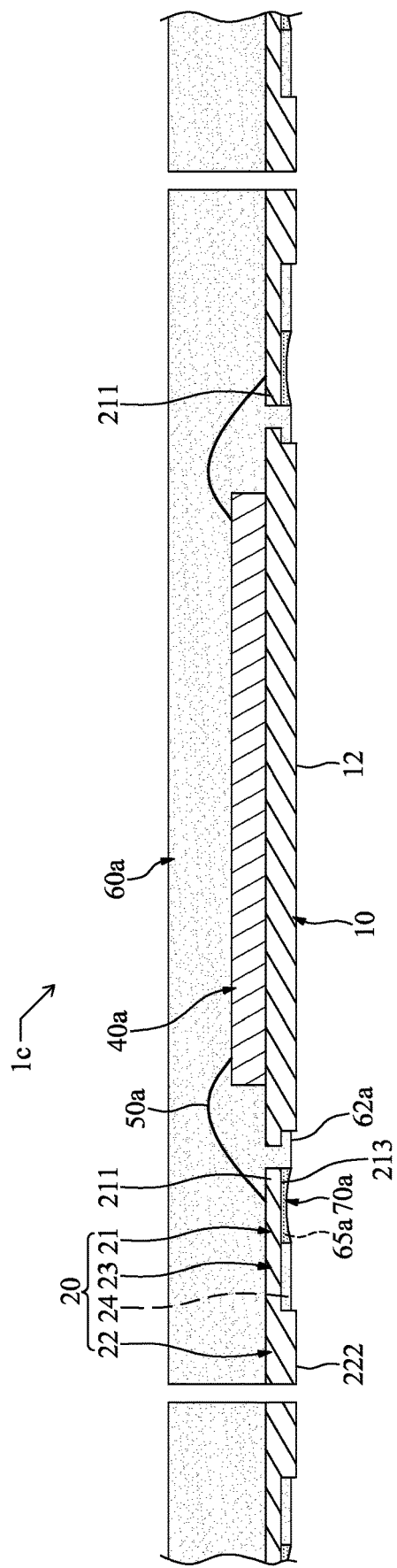
FIG. 35 illustrates one or more stages of an example of a method for manufacturing a device according to some embodiments of the present disclosure.

Referring to FIG. 33, FIG. 34 and FIG. 35, a singulation process is conducted to obtain a plurality of devices 1c of FIG. 10.

Figure 36:
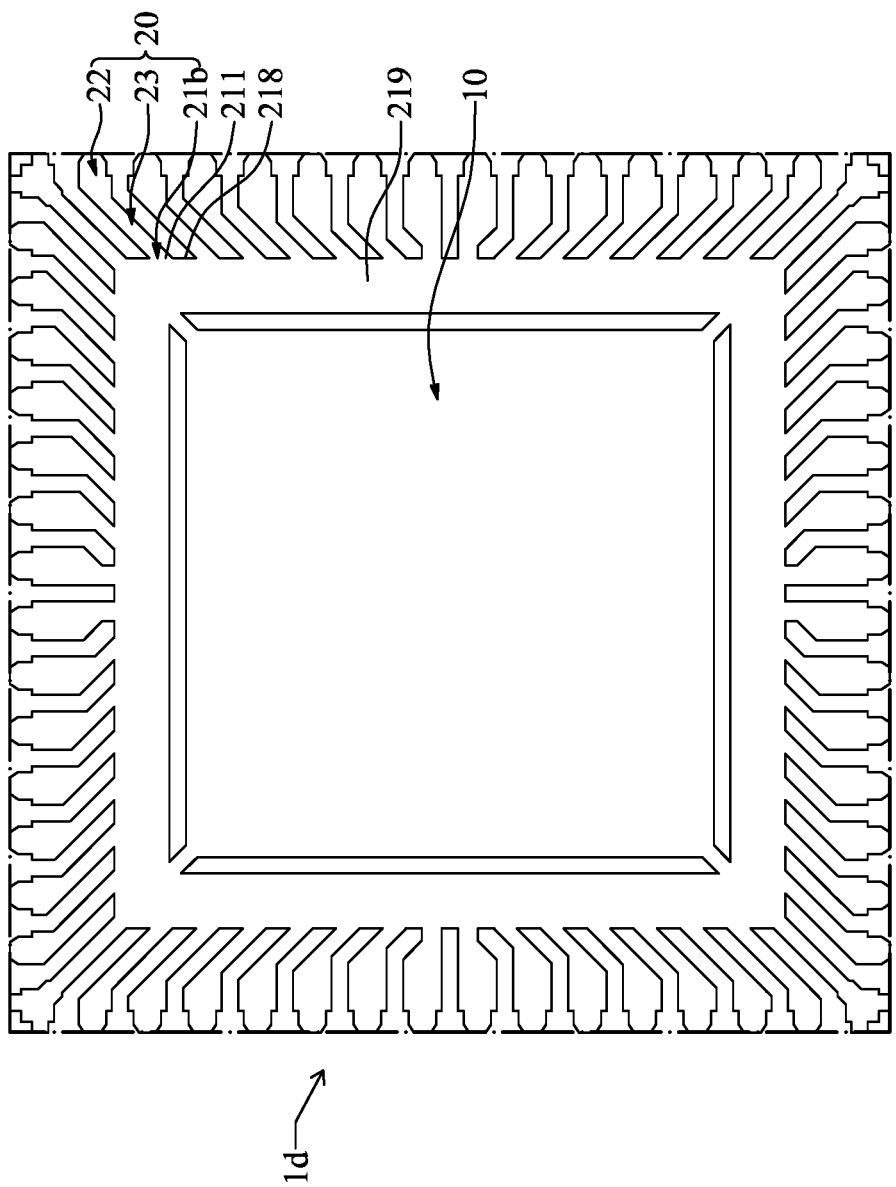
FIG. 36 illustrates a top view of a device according to some embodiments of the present disclosure.

FIG. 36 illustrates a top view of a device 1d according to some embodiments of the present disclosure. The device 1d is similar to the device 1 shown in FIG. 2 and FIG. 4, except for the structure of the inner lead portion 21b. The inner lead portion 21b of FIG. 36 omits the lower support section 212, and all of the upper bond sections 211 of the inner lead portions 21b are connected to each other through a plurality of connecting sections 218, thereby forming a bond ring 219. In some embodiments, the upper bond sections 211 and the connecting sections 218 are formed integrally (e.g. and concurrently) as a monolithic structure. In some embodiments, the bond ring 219 may be in a square shape.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A device, comprising:
a die paddle; and
a plurality of leads surrounding the die paddle, each of the plurality of leads including an inner lead portion adjacent to and spaced apart from the die paddle, an outer lead portion opposite to the inner lead portion and a bridge portion between the inner lead portion and the outer lead portion, the inner lead portion having an upper bond section connected to the bridge portion and a lower support section below the upper bond section, wherein a sum of a thickness of the upper bond section and a thickness of the lower support section is greater than a thickness of the bridge portion; and
a coating in an opening of each of the plurality of leads surrounding the die paddle, the coating contains a material different from a material of an encapsulant.

2. The device of claim 1, wherein the lower support section and the upper bond section are formed integrally as a monolithic structure.

3. The device of claim 1, wherein each of the plurality of leads further includes a cavity between the outer lead portion and the lower support section of the inner lead portion.

4. The device of claim 1, wherein all of the lower support sections of the inner lead portions are connected to each other to form a support ring.

5. The device of claim 1, wherein the sum of the thicknesses of the upper bond section and the lower support section is substantially equal to a thickness of the outer lead portion.

6. The device of claim 1, wherein the thickness of the lower support section is substantially equal to the thickness of the upper bond section.

7. The device of claim 1, wherein the thickness of the upper bond section is substantially equal to the thickness of the bridge portion.

8. The device of claim 3, wherein a depth of the cavity is substantially equal to the thickness of the lower support section.

9. The device of claim 3, wherein a depth of the cavity is substantially equal to the thickness of the bridge portion.

10. The device of claim 4, wherein the support ring has a uniform thickness that is substantially equal to the thickness of the lower support section.

11. The device of claim 1, wherein the inner lead portion, the outer lead portion and the bridge portion are formed integrally as a monolithic structure.

12. The device of claim 1, wherein the upper bond section has a side surface adjacent to the die paddle, the lower support section has a side surface adjacent to the die paddle, and the side surface of the lower support section is substantially coplanar with the side surface of the upper bond section.

13. A device, comprising:
a die paddle;
a semiconductor die disposed on the die paddle;
a plurality of leads surrounding the die paddle, each of the plurality of leads including an inner lead portion adjacent to and spaced apart from the die paddle and an outer lead portion opposite to the inner lead portion;
a plurality of bonding wires for electrically connecting the semiconductor die and an upper bond section of each of the inner lead portions;
an encapsulant covering the semiconductor die, the die paddle, the bonding wires and the plurality of leads, and defining at least one opening on a bottom surface thereof to expose a bottom surface of the upper bond section of the inner lead portion; and
a coating in an opening of each of the plurality of leads surrounding the die paddle to cover the bottom surface of the upper bond section of the inner lead portion, the coating contains a material different from a material of the encapsulant.

14. The device of claim 13, wherein the bottom surface of the upper bond section is an etched surface.

15. The device of claim 13, wherein the at least one opening of the encapsulant includes a plurality of openings spaced apart from each other, and each of the upper bond sections of the inner lead portions is exposed from a respective one of the plurality of openings.

16. The device of claim 13, wherein the coating is recessed from a bottom surface of the encapsulant.

17. The device of claim 13, wherein a material of the coating is different from a material of the encapsulant.

18. The device of claim 13, wherein a thickness of the coating is less than a thickness of the upper bond section.

19. The device of claim 13, wherein each of the plurality of leads further includes a bridge portion between the inner lead portion and the outer lead portion, and a thickness of the coating is less than a thickness of the bridge portion.

20. The device of claim 13, wherein the at least one opening of the encapsulant is a ring-shaped opening.

21. The device of claim 20, wherein the coating is disposed in the ring-shaped opening.

22. The device of claim 21, wherein the coating surrounds the die paddle.

* * * * *